(12) United States Patent
Gu et al.

(10) Patent No.: US 9,899,516 B2
(45) Date of Patent: Feb. 20, 2018

(54) ENGINEERED FERROELECTRIC GATE DEVICES

(71) Applicants: Zongquan Gu, Chalfont, PA (US); Mohammad Anwarul Islam, Warners, NY (US); Jonathan Eli Spanier, Bala Cynwyd, PA (US)

(72) Inventors: Zongquan Gu, Chalfont, PA (US); Mohammad Anwarul Islam, Warners, NY (US); Jonathan Eli Spanier, Bala Cynwyd, PA (US)

(73) Assignee: DREXEL UNIVERSITY, Philadelphia, PA (US)

( * ) Notice: Subject to any disclaimer, the term of this patent is extended or adjusted under 35 U.S.C. 154(b) by 0 days.

(21) Appl. No.: 15/281,406

(22) Filed: Sep. 30, 2016

(65) Prior Publication Data
US 2017/0098713 A1    Apr. 6, 2017

Related U.S. Application Data

(60) Provisional application No. 62/235,784, filed on Oct. 1, 2015.

(51) Int. Cl.
*H01L 29/78* (2006.01)
*H01L 29/49* (2006.01)
(Continued)

(52) U.S. Cl.
CPC .. *H01L 29/78391* (2014.09); *H01L 27/11585* (2013.01); *H01L 29/4966* (2013.01); *H01L 29/775* (2013.01); *H01L 29/778* (2013.01)

(58) Field of Classification Search
CPC combination set(s) only.
See application file for complete search history.

(56) References Cited

U.S. PATENT DOCUMENTS

| 5,481,490 A * | 1/1996 | Watanabe | H01L 28/55 |
| | | | 257/E21.009 |
| 2005/0233476 A1 * | 10/2005 | Tatsunari | H01L 29/78391 |
| | | | 438/3 |

(Continued)

OTHER PUBLICATIONS

Tra, Vu Thanh, et al. "Ferroelectric control of the conduction at the LaAlO3/SrTiO3 heterointerface." Advanced Materials 25.24 (2013): 3357-3364.

(Continued)

*Primary Examiner* — Mamadou Diallo
(74) *Attorney, Agent, or Firm* — Mendelsohn Dunleavy, P.C.

(57) ABSTRACT

Coupling of switchable ferroelectric polarization with the carrier transport in an adjacent semiconductor enables a robust, non-volatile manipulation of the conductance in a host of low-dimensional systems, including the two-dimensional electron liquid that forms at the $LaAlO_3$—$SrTiO_3$ interface. However, the strength of the gate-channel coupling is relatively weak, limited in part by the electrostatic potential difference across a ferroelectric gate. Compositionally grading of $PbZr_{1-x}Ti_xO_3$ ferroelectric gates enables a more than twenty-five-fold increase in the LAO/STO channel conductance on/off ratios. Incorporation of polarization gradients in ferroelectric gates can enable significantly enhanced performance of ferroelectric non-volatile memories.

20 Claims, 26 Drawing Sheets
(25 of 26 Drawing Sheet(s) Filed in Color)

(51) Int. Cl.
*H01L 27/11585* (2017.01)
*H01L 29/775* (2006.01)
*H01L 29/778* (2006.01)

(56) References Cited

U.S. PATENT DOCUMENTS

| | | | |
|---|---|---|---|
| 2006/0073706 A1* | 4/2006 | Li | H01L 21/31116 438/710 |
| 2011/0147723 A1* | 6/2011 | Hodges, Jr. | H01L 51/0529 257/40 |
| 2012/0098589 A1* | 4/2012 | Spanier | B82Y 10/00 327/530 |
| 2013/0104969 A1* | 5/2013 | Rappe | H01L 31/032 136/255 |
| 2014/0117409 A1* | 5/2014 | Chou | H01L 29/78615 257/192 |
| 2014/0203707 A1* | 7/2014 | King | H01J 9/02 315/111.81 |
| 2015/0041873 A1* | 2/2015 | Karda | H01L 21/28291 257/295 |
| 2016/0276014 A1* | 9/2016 | Fox | G11C 11/221 |

OTHER PUBLICATIONS

Kim, Shin-Ik, et al. "Non-Volatile Control of 2DEG Conductivity at Oxide Interfaces." Advanced Materials 25.33 (2013): 4612-4617.

Ban, Z-G., S. P. Alpay, and J. V. Mantese. "Fundamentals of graded ferroic materials and devices." Physical Review B 67.18 (2003): 184104.

Misirlioglu, I. B., et al. "Low-voltage ferroelectric-paraelectric superlaffices as gate materials for field-effect transistors." Journal of Materials Science (2015), pp. 1-12.

Mantese, Joseph V., et al. "Ferroelectric thin films with polarization gradients normal to the growth surface." Applied physics letters 67.5 (1995): 721-723.

Agar, Joshua C., et al. "Complex Evolution of Built-in Potential in Compositionally-Graded $PbZr_{1-x}Ti_xO_3$ Thin Films." ACS nano 9.7 (2015): 7332-7342.

Mangalam, R. V. K., et al. "Unexpected Crystal and Domain Structures and Properties in Compositionally Graded $PbZr_{1-x}Ti_xO_3$ Thin Films." Advanced Materials 25.12 (2013): 1761-1767.

Gu, Zongquan, Mohammad A. Islam, and Jonathan E. Spanier. "Giant enhancement in the ferroelectric field effect using a polarization gradient." Applied Physics Letters 107.16 (2015): 162901.

Jia, Chun-Lin, et al. "Unit-cell scale mapping of ferroelectricity and tetragonality in epitaxial ultrathin ferroelectric films." Nature materials 6.1 (2007): 64-69.

Agar, J. C., et al. "Highly mobile ferroelastic domain walls in compositionally graded ferroelectric thin films." Nature materials (2016).

* cited by examiner

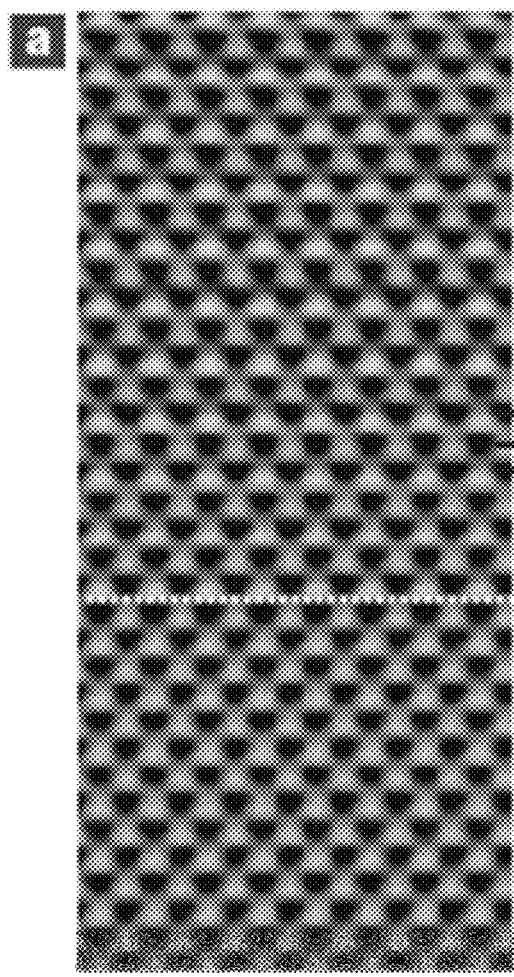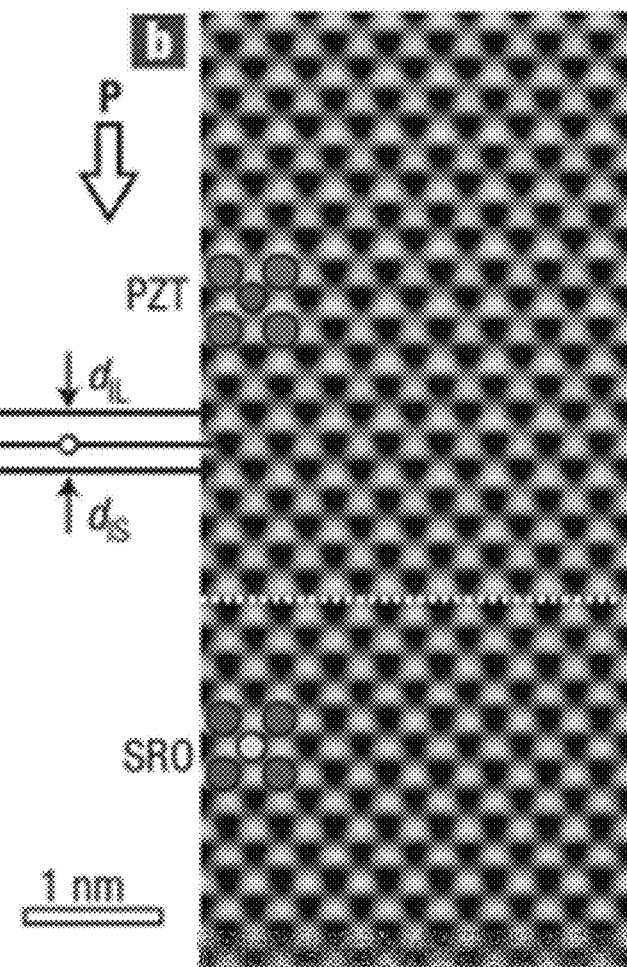
FIG. 5A                    FIG. 5B

ENGINEERED FERROELECTRIC GATE DEVICES

RELATED APPLICATION DATA

This application claims priority to U.S. Provisional Application No. 62/235,784, filed Oct. 1, 2015, the entire disclosure of which is hereby incorporated by reference as if set forth fully herein.

STATEMENT OF GOVERNMENT INTEREST

This invention was made with government support under Grant No. NSF DMR 1124696 awarded by the National Science Foundation (NSF). The Government has certain rights in this invention.

FIELD OF THE INVENTION

The present invention relates to a ferroelectric field effect transistor. In particular, the present invention relates to a ferroelectric gate device of a field effect transistor comprising a compositionally graded ferroelectric film.

DESCRIPTION OF THE RELATED TECHNOLOGY

Ferroelectric field effect transistors are promising for non-volatile memory elements and other functionalities associated with incorporation of switchable polarization. Large figures of merit, i.e., ratios of drain and source currents or of resistances in the on and off states, have been reported in ferroelectrically-gated two-dimensional (2D) or one-dimensional (1D) or 1D-like channels, e.g. Pb(Zr,Ti)O$_3$ (PZT) with MoS$_2$ (Zhou et al., Nanoscale 7, 8695, 2015), graphene (Baeumer et al., Nature communications 6, 6136, 2015), carbon nanotubes (Sakurai et al., Japanese Journal of Applied Physics 45, L1036, 2006), and with semiconductor nanowires, e.g., ZnO (Liao et al., ACS Nano 3, 700, 2009). The effect has also been demonstrated using organic ferroelectric polyvinylidene fluoride (PVDF) on various channels (Zheng et al., Phys. Rev. Lett. 105, 166602, 2010; Son et al., ACS Nano 4, 7315, 2010), LiNbO$_3$ with MoS$_2$ (Nguyen et al., Nano letters 15, 3364, 2015), BaTiO$_3$ with carbon nanotubes (Fu et al., Nano letters 9, 921, 2009) and the relaxor ferroelectric Pb(Mn,Nb)O$_3$—PbTiO$_3$(PMN-PT) with graphene (Jie et al., The Journal of Physical Chemistry C 117, 13747, 2013).

The discovery of a two dimensional electron liquid (2DEL) at the interface of band insulators LaAlO$_3$ (LAO) and SrTiO$_3$ (STO) with few- and larger-unit cell thickness of LAO generated significant interest following the findings of magnetic (Ohtomo and Hwang, Nature 427, 423, 2004, Brinkman et al., Nature materials 6, 493, 2007) and superconducting ordering (Reyren et al, Science 317, 1196, 2007), room-temperature local surface-controlled switching of conductance (Bark et al., Nano Letters 12, 1765, 2012) and of photoconductivity (Tebano et al., ACS Nano 6, 1278, 2012). The similar interfacial conductivities in other STO-based oxide heterostructures have stimulated the development of prototype field-effect transistors (FETs) (Boucherit et al., Applied Physics Letters 102, 242909, 2013, Hosoda et al., Applied Physics Letters 103, 103507, 2013). However the poor interface between oxides and common metal electrodes can deteriorate device properties (Karthik et al., Advanced Materials 24, 1610, 2012). While local surface control of the 2D electronic state enables nanoscale reconfigurable electronics and photodetectors, these devices retain their written state for only a matter of hours (Bi et al., Applied Physics Letters 97, 173110, 2010, Xie et al., Advanced Materials 23, 1744, 2011).

Recently, ferroelectric polarization in a Pb(Zr$_{0.2}$Ti$_{0.8}$)O$_3$ gate insulator on LAO/STO has been shown to be a promising isostructural all-oxide route for non-volatile manipulation of the near-surface two-dimensional electron liquid (2DEL) conductance in LAO/STO (Tra et al., Advanced Materials 25, 3357, 2013, Kim et al., Advanced Materials 25, 4612, 2013). When polarization, P in the PZT layer is oriented upward (downward) in the plane-normal direction (z), the Sr 3d core level is lowered (lifted), tuning the overlapping between the LAO valence band maximum (VBM) and STO conduction band minimum (CBM) to deplete (accumulate) electrons at the interface (Tra et al., Advanced Materials 25, 3357, 2013). Therefore the field effect is largely dependent on the ferroelectric properties of the film, particularly the size of the potential drop across the film, $V_{PZT}$, which is nearly zero in cases of almost complete screening of polarization charge.

Introduction of gradients in the composition and/or strain in ferroelectric thin films, producing gradients in ferroelectric polarization and in electrostatic potential, can be highly effective in achieving significant improvements in the dielectric, pyroelectric, piezoelectric and related properties of ferroelectrics (Mantese et al., Applied Physics Letters 67, 721, 1995, Ban et al., Physical Review B 67, 184104, 2003, Mangalam et al., Advanced Materials 25, 1761, 2013). Recently, superlattices of ferroelectric and paraelectric layers have been proposed for low-power transistors (Misirlioglu et al., Journal of Materials Science 1-12, 2015).

The present invention provides a compositionally graded ferroelectric film for a ferroelectric gate device useful in a field effect transistor. Based on calculations coupling Landau-Ginzburg-Devonshire (LGD) theory in PbZr$_{1-x}$Ti$_x$O$_3$ with self-consistent Poisson-Schrodinger (PS) models in an adjacent LAO-STO channel, the compositionally graded ferroelectric film with a polarization gradient across the film thickness will enable an increase in the gating ratio of more than 2500%, compared with a film without the compositional gradient having the same film thickness.

SUMMARY OF THE INVENTION

In one aspect, the present invention provides a ferroelectric gate device for a field effect transistor comprising a compositionally graded ferroelectric film including a ferroelectric material having a formula of $A_{(1-y)}A'_yB_{(1-x)}B'_xO_3$, where A and A' each represent an element independently selected from lanthanides, alkaline earth metals, and alkali metals, B and B' each represent an independently selected transition metal, x is in the range of from about 0 to about 1, y is in the range of from about 0 to about 1, and the ferroelectric material has a composition gradient along a thickness of the ferroelectric film with x decreasing from one side to another side of the ferroelectric film.

In another aspect, the ferroelectric gate device includes a ferroelectric material selected from PbZr$_{1-x}$Ti$_x$O$_3$ and Ba$_x$Sr$_{(1-x)}$TiO$_3$.

In yet another aspect, the ferroelectric gate device forms part of a field effect transistor comprising a channel that comprises an LaAlO$_3$—SrTiO$_3$ interface.

In another embodiment, the invention relates to a ferroelectric gate device of a field effect transistor comprising a compositionally graded ferroelectric film including a ferroelectric material having a formula of $A_{(1-y)}A'_yB_{(1-x)}B'_xO_3$, where A and A' each represent an element independently selected from lanthanides, alkaline earth metals, and alkali metals, B and B' each represent an independently selected transition metal, x is in the range of from about 0 to about 1, y is in the range of from about 0 to about 1, and the ferroelectric material has a composition gradient along a thickness of the ferroelectric film with x decreasing from one side to another side of the ferroelectric film.

The ferroelectric gate device of may have a composition gradient along the entire thickness of the ferroelectric film.

In the ferroelectric gate device of each of the foregoing embodiments, the field effect transistor may have a channel and the gradient of the ferroelectric material has x decreasing from a side distal to the channel to a side proximal to the channel.

In the ferroelectric gate device of each of the foregoing embodiments, x may be in a range of from about 0.1 to about 0.9, or x may be in a range of from about 0.2 to about 0.8, or x may be in a range of from about 0.3 to about 0.7. In each of the foregoing embodiments, y may be about 0.

In each of the foregoing embodiments, the ferroelectric material may be selected from $PbZr_{1-x}Ti_xO_3$ and $Ba_xSr_{(1-x)}TiO_3$.

In each of the foregoing embodiments, the transistor of the ferroelectric gate device may include a channel that comprises a material selected from C, Si, Ge, SiC, SiGe, AlSb, AlAs, MN, AlP, BN, BP, BaS, GaSb, GaAs, GaN, GaP, InSb, InAs, InN, InP, AlGaAs, $Al_zGa_{1-z}As$ or $In_zGa_{1-z}As$, where z is in the range of from 0 to 1, InGaAs, InGaP, AlInAs, AlInSb, GaAsN, GaAsP, AlGaN, AlGaP, InGaN, InAsSb, InGaSb, AlGaInP, InAlGaP, InGaAlP, AlInGaP, AlGaAsP, InGaAsP, AlInAsP, AlGaAsN, InGaAsN, InAlAsN, GaAsSbN, GaInNAsSb, GaInAsSbP, CdSe, CdS, CdTe, ZnO, ZnSe, ZnS, ZnTe, CdZnTe, CZT, HgCdTe, HgZnTe, HgZnSe, CuCl, PbSe, PbS, PbTe, SnS, SnTe, PbSnTe, $Tl_2SnTe_5$, $Tl_2GeTe_5$, $Bi_2Te_3$, $Cd_3P_2$, $Cd_3As_2$, $Cd_3Sb_2$, $Zn_3P_2$, $Zn_3As_2$, $Zn_3Sb_2$, $PbT_2$, $MoS_2$, GaSe, SnS, $Bi_2S_3$, CIGS, PtSi, $BiI_3$, $HgI_2$, TlBr, $TiO_2$, $Cu_2O$, CuO, $UO_2$, $UO_3$, graphene, carbon nanotube, and semiconductor nanowire.

In certain embodiments the channel may comprise a material selected from Si, SiGe, GaAs, GaN, graphene, carbon nanotube, semiconductor nanowire, ZnO, and $MoS_2$. Each of the foregoing embodiments may include a transistor wherein the channel may comprise an $LaAlO_3$—$SrTiO_3$ interface.

The ferroelectric gate device may include a ferroelectric film that enables at least about a 5-fold increase in a channel conductance on/off ratio of the transistor in comparison with a ferroelectric film of the same thickness but without a composition gradient. In some embodiments, the ferroelectric film enables at least about a 10-fold increase in channel conductance on/off ratio of the transistor in comparison with a ferroelectric film of the same thickness but without a composition gradient. In some embodiments, the ferroelectric film enables at least about a 15-fold increase in channel conductance on/off ratio of the transistor in comparison with a ferroelectric film of the same thickness but without a composition gradient.

In some embodiments, the ferroelectric film enables at least about a 25-fold increase in channel conductance on/off ratio of the transistor in comparison with a ferroelectric film of the same thickness but without a composition gradient.

In each of the foregoing embodiments, the ferroelectric film may have a thickness of from about 30 nm to about 150 nm or a thickness of from about 50 nm to about 150 nm or a thickness of from about 50 nm to about 100 nm, or a thickness of from about 80 nm to about 100 nm.

In each of the foregoing embodiments, the channel may be selected from two-dimensional, one-dimensional and one-dimensional like channels.

BRIEF DESCRIPTION OF THE DRAWINGS

The application file contains at least one drawing executed in color. Copies of this patent application publication with color drawings will be provided by the Office upon request and payment of the necessary fee.

Applicants respectfully request the color drawings being admitted in the application upon payment of the enclosed fee set forth in 37 CFR 1.17(h).

FIG. 5A is a high-resolution transmission electron microscopy (HRTEM) image obtained from averaging intensity respecting the horizontal lattice periodicity over 42 unit cells.

FIG. 5B is another HRTEM image obtained using a computer model constructed by the iterative procedure (specimen thickness: 5.5 nm and defocus value: −35 nm). The polarization direction of the PZT film is shown by an arrow P, pointing from the film interior to the interface of PZT/SRO. White dotted lines mark the SRO/PZT interface. The cation positions are indicated as follows, Pb: green; Zr/Ti: red; Sr: violet; Ru: yellow.

DETAILED DESCRIPTION OF THE PREFERRED EMBODIMENT(S)

Figure 1A:
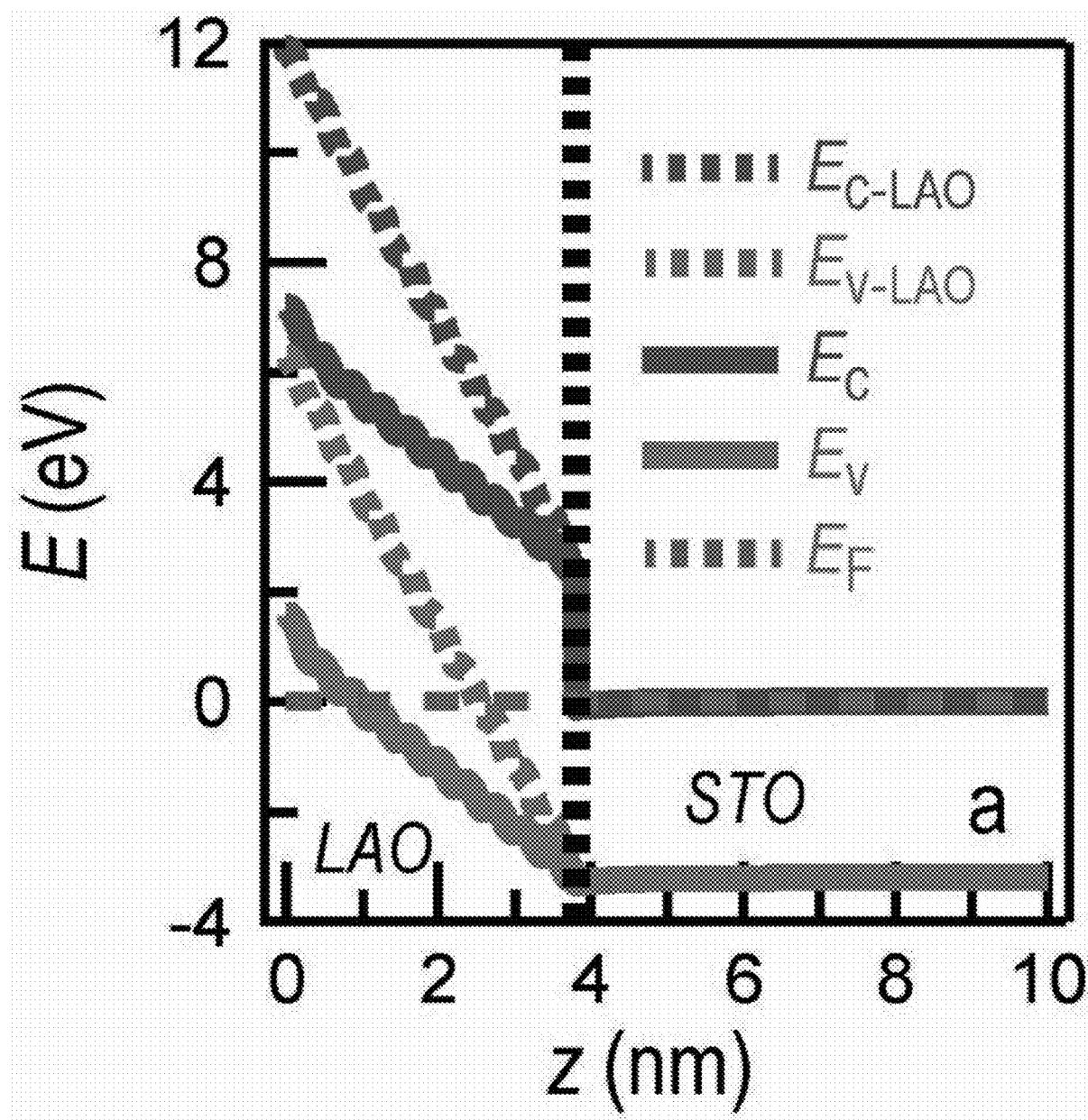
FIG. 1A shows a band profile of a 10 u.c. LAO on STO at T=4.2 K of a compositionally graded ferroelectric film according to one aspect of the present disclosure.

For illustrative purposes, the principles of the present invention are described by referencing various exemplary embodiments. Although certain embodiments of the invention are specifically described herein, one of ordinary skill in the art will readily recognize that the same principles are equally applicable to, and can be employed in, other systems and methods. Before explaining the disclosed embodiments of the present invention in detail, it is to be understood that the invention is not limited in its application to the details of any particular embodiment shown. Additionally, the terminology used herein is for the purpose of description and not for limitation. Furthermore, although certain methods are described with reference to steps that are presented herein in a certain order, in many instances, these steps can be performed in any order as may be appreciated by one skilled in the art; the novel method is therefore not limited to the particular arrangement of steps disclosed herein.

It must be noted that as used herein and in the appended claims, the singular forms "a", "an", and "the" include plural references unless the context clearly dictates otherwise. Furthermore, the terms "a" (or "an"), "one or more", and "at least one" can be used interchangeably herein. The terms "comprising", "including", "having" and "constructed from" can also be used interchangeably.

It is to be understood that each component, compound, substituent, or parameter disclosed herein is to be interpreted as being disclosed for use alone or in combination with one or more of each and every other component, compound, substituent, or parameter disclosed herein.

The present disclosure provides a ferroelectric gate device for a field effect transistor comprising a compositionally graded ferroelectric film including a ferroelectric material having a formula of $A_{(1-y)}A'_{y}B_{(1-x)}B'_{x}O_3$, where A and A' each represent an element independently selected from lanthanides, alkaline earth metals, and alkali metals, B and B' each represent an independently selected transition metal, x is in the range of from about 0 to about 1, y is in the range of from about 0 to about 1, and the ferroelectric material has a composition gradient along a thickness of the ferroelectric film with x decreasing from one side to another side of the ferroelectric film.

Examples of suitable ferroelectric gate material are $PbZr_{1-x}Ti_xO_3$ and barium strontium titanate, $Ba_{(1-x)}Sr_xTiO_3$. The semiconducting materials that may be used in the transistor include C, Si, Ge, SiC, SiGe, AlSb, AlAs, MN, AlP, BN, BP, BaS, GaSb, GaAs, GaN, GaP, InSb, InAs, InN, InP, AlGaAs, $Al_xGa_{1-x}As$ or $In_xGa_{1-x}As$ where x is in the range of from 0 to 1, InGaAs, InGaP, AlInAs, AlInSb, GaAsN, GaAsP, AlGaN, AlGaP, InGaN, InAsSb, InGaSb, AlGaInP, InAlGaP, InGaAlP, AlInGaP, AlGaAsP, InGaAsP, AlInAsP, AlGaAsN, InGaAsN, InAlAsN, GaAsSbN, GaInNAsSb, GaInAsSbP, CdSe, CdS, CdTe, ZnO, ZnSe, ZnS, ZnTe, CdZnTe, CZT, HgCdTe, HgZnTe, HgZnSe, CuCl, PbSe, PbS, PbTe, SnS, SnTe, PbSnTe, $Tl_2SnTe_5$, $Tl_2GeTe_5$, $Bi_2Te_3$, $Cd_3P_2$, $Cd_3As_2$, $Cd_3Sb_2$, $Zn_3P_2$, $Zn_3As_2$, $Zn_3Sb_2$, $PbT_2$, $MoS_2$, GaSe, SnS, $Bi_2S_3$, CIGS, PtSi, $BiI_3$, $HgI_2$, TlBr, $TiO_2$, $Cu_2O$, CuO, $UO_2$, $UO_3$, all organic semiconductors, all semiconductors that may include dilute concentrations of ferromagnetic materials and any combination thereof. Non-ferric perovskites and metallic oxides such as $SrRuO_3$ may also be used.

The semiconducting materials that may be used in the transistor may also be selected from graphene, carbon nanotubes, and semiconductor nanowires.

In one aspect, A PZT ferroelectric gate insulator on an LAO/STO 2DEL is provided. The ferroelectric properties of the PZT gate may be evaluated with the internal potential $V_{PZT}(x_3)$ to study its effect on the spatially modulated carrier concentration $n_e$ at and near the LAO/STO interface, and then the corresponding conductivity σ can be calculated.

The intrinsic LAO-STO model uses an initial input of the band profile $E_{in}$ containing the conduction band $E_c$ and the valence band $E_v$ in the Schrodinger equation to solve for the $i^{th}$ bound eigenenergies $E_e^x$ and wavefunctions $\psi_e^x$ for electrons and the $j^{th}$ for holes respectively following the Numerov method (Blatt et al., *Journal of Computational Physics* 1, 382, 1967).

$$\left(-\frac{\hbar^2}{2m_e}\frac{d^2}{dx_3^2} + E_c\right)\psi_e^i = E_e^i\psi_e^i \quad (1)$$

$$\left(\frac{\hbar^2}{2m_h}\frac{d^2}{dx_3^2} + E_v\right)\psi_h^j = E_h^j\psi_h^j \quad (2)$$

$E_e$ and $E_v$ are separated by the bandgap of STO (3.2 eV) and for LAO (5.6 eV). At the interface, the valence band offset $\Delta E_v$=0.1 eV (Reinle-Schmitt et al., *Nature Communications* 3, 932, 2012), higher in LAO, is specified. The effective mass of the hole $m_h$=1.2 $m_0$ (Pentcheva et al., *Phys. Rev. Lett.* 104, 166804, 2010) where $m_0$ is the free electron mass is kept identical in all calculations, and the effective mass of the electron $m_e$ spans from 0.4 $m_0$ to 14 $m_0$ (Pentcheva et al., *Phys. Rev. Lett.* 104, 166804, 2010, Santander-Syro et al., *NATURE* 469, 189, 2011, Zhong et al., *Phys. Rev. B* 87, 161102, 2013, Shen et al., *Phys. Rev. B* 86, 195119, 2012). The electron sheet carrier density $n_{ss}$ and the hole $p_{ss}$ are calculated by summing the obtained bound eigenenergies:

$$n_{ss} = \int_0^\infty g_{2D,e}(E) f_{FD}(E) dE = \sum_{i=1}^t \frac{4\pi m_e k_B T}{\hbar^2} \cdot \ln\left[1 + e^{(E_F - E_e^i)/k_B T}\right] \cdot \Delta E \quad (3)$$

$$p_{ss} = \quad (4)$$
$$\int_{-\infty}^0 g_{2D,h}(E) f_{FD}(E) dE = \sum_{j=1}^m \frac{4\pi m_h k_B T}{\hbar^2} \cdot \ln\left[1 + e^{(E_h^f - E_F)/k_B T}\right] \cdot \Delta E$$

where $g_{2D}$, $f_{FD}$, $k_B$, h and $E_F$ are the two dimensional density of states, Fermi-Dirac distribution function, the Boltzmann constant, Planck's constant, and the Fermi level. $E_F$ is pinned to satisfy the charge neutrality between the holes and electrons. The spatial electron and hole volume densities $n_e$ and $p_h$ are found by:

$$n_e = \sum_{i=1}^t n_{ss,i} \cdot |\psi_e^i|^2 \quad (5)$$

$$p_h = \sum_{j=1}^m p_{ss,j} \cdot |\psi_h^j|^2 \quad (6)$$

Assuming a sharp interface, the charge concentrations of $LaO^+$ and $AlO^-_2$ layers $N_{LaO}$ and $N_{AlO2}$ are determined by the c-axis value of LAO unit cell (u.c.) 3.8 from a stoichiometric film (Qiao et al., *Phys. Rev. B* 83, 085408, 2011) and the a-axis value 3.905 Å equal to that for STO. The STO thickness is set to be 100 nm. Along with $n_e$ and $p_h$, they included in solving the Poisson equation:

$$\frac{d}{dx_3}[\varepsilon_0 \varepsilon_r(F) F] = q(N_{LaO+} - N_{AlO_2^-} + p_h - n_e) \quad (7)$$

In the equation, the LAO relative permittivity $\in_r$ is 24 and STO is set to be $$\frac{1}{A(T) + B(T) \cdot [F]} + \varepsilon_r(F = \infty)$$

(Neville et al., *Journal of Applied Physics* 43, 1972, Biscaras et al., *Phys. Rev. Lett.* 108, 247004, 2012) where F is the electric field and $\in_r$ (F=∞)=300 for bulk is added to compensate the extreme high magnitude of F at the interface. F is set to be 0 at LAO surface due to the charge neutrality and the continuous electric displacement condition is imposed at the LAO and STO interface. F is solved in the Maxwell-Gauss form of the Poisson equation since the STO dielectric constant is field and temperature dependent and the output band profile $E_{out}$ is computed to be the integral product of F along $\times 3$. The program iterates until the difference of each step along the sample is lower than 0.5 meV between $E_{in}$ and $E_{out}$, otherwise the successive iteration continues by $E_{in}(n^{th}) = 0.95 \cdot E_{in}(n-1^{th}) + 0.05 \cdot E_{out}(n-1^{th})$. The self-consistency is satisfied that (1) the eigenenergies for hole in LAO are basically kept constant because of the large band o set at the interface, and (2) if $E_{in}(n^{th})$ in STO is deeper than the actual band bending, the eigenenergies for electrons are located lower and consequently $E_F$ is pinned to a higher position to conserve the neutrality. This leads to a lower sheet carrier density $n_{ss}$. The subsequent volume carrier density $n_e$ and the integrated $E_{out}(n-1^{th})$ from the Poisson equation is suppressed; If $E_{in}(n-1^{th})$ is shallower, $E_{out}(n-1^{th})$ becomes steeper.

Since the PS solution accounts for overlapping of the electrostatic potential build-up in LAO and band bending in STO, incorporation of the PZT ferroelectricity is introduced through its electrostatic (field-effect) doping on the system. In this model, the overlapping between LAO and STO is decreased (increased) when PZT is polarized up (down), and in both cases the modulation magnitude is equal to $V_{PZT}$. $V_{PZT}$ is induced by the spatial variation of the out-of-plane polarization $P_z$ as determined using the LGD model. The ferroelectric free energy:

$$G_{tot} = \int_0^L (g_{bulk} + g_{grad} + g_{depj} + g_{flexo}) dx_3$$

where $g_{bulk}$, $g_{grad}$, $g_{dep}$ and $g_{flexo}$ are the bulk, gradient, depolarization and flexoelectric energy densities, respectively, and L is the PZT film thickness. Minimizing $G_{tot}$ yields the master equation for $P_3$.

The LAO-STO model may incorporate $V_{PZT}$. When the $P_3$ profile is deduced in the LGD model, its spatial variation is used to solve $V_{PZT}$. The $V_{PZT}$ magnitude is added to the intrinsic overlapping $\Delta E$ between the LAO VBM and the STO CBM. Depending on the $P_3$ polarity, the modified overlapping is set to be $\Delta E V_{PZT}$. With the modification, the Poisson-Schrodinger model follows the same steps as in the intrinsic case.

The energy densities may be derived from the P3 master equation, as shown below.

$$g_{bulk} = a_1 P_3^2 + a_{11} P_3^1 + a_{111} P_3^0 - \quad (9)$$
$$\frac{1}{2} s_{11} (\sigma_1^2 + \sigma_2^2) - s_{12} \sigma_1 \sigma_2 - Q_{12}(\sigma_1 + \sigma_2) P_3^2$$

$$g_{grad} = \frac{1}{2} g_{33} \left(\frac{d^2 P_3}{dx_3^2}\right)^2 \quad (10)$$

$$g_{dep} = \frac{1}{2\varepsilon_0 \varepsilon_b}\left(P_3 - \frac{1}{L}\int_0^L P_3 \, dx_3\right) P_3 \quad (11)$$

$$g_{flexo} = \frac{1}{2} f_{12}\left(\sigma_1 \frac{dP_3}{dx_3} - P_3 \frac{d\sigma_1}{dx_3}\right) + \frac{1}{2} f_{12}\left(\sigma_2 \frac{dP_3}{dx_3} - P_3 \frac{d\sigma_2}{dx_3}\right) \quad (12)$$

where $\in_b$ is the background dielectric constant.

The minimization of the total energy yields the Euler-Lagrange equations:

$$\frac{\partial(g_{bulk} + g_{grad} + g_{dep} + g_{flexo})}{\partial P_3} - \quad (13)$$
$$\frac{\partial}{\partial x_3} \frac{\partial(g_{bulk} + g_{grad} + g_{dep} + g_{flexo})}{\partial\left(\frac{\partial P_3}{\partial x_3}\right)} = 0$$

$$\frac{\partial(g_{bulk} + g_{grad} + g_{dep} + g_{flexo})}{\partial P_3} - \quad (14)$$
$$\frac{\partial}{\partial x_3} \frac{\partial(g_{bulk} + g_{grad} + g_{dep} + g_{flexo})}{\partial\left(\frac{\partial \sigma}{\partial x_3}\right)} = 0$$

where $\sigma=\sigma_1=\sigma_2$ is the in-plane stress and since STO is cubic Eq. (14) yields:

$$\sigma_1 = \sigma_2 = \frac{1}{s_{11}+s_{12}}\left(u_s - Q_{12}P_3^2 + f_{12}\frac{dP_3}{dx_3}\right) \quad (15)$$

where $u_s=(a_{STO}-a_{PZT})/a_{PZT}$ is the in-plane strain of the PZT film.

Inserting Eq. (15) into Eq. (13) and after rearranging terms, the $P_3$ master equation becomes:

$$\left(2a_1 - 4Q_{12}\frac{u_s}{s_{11}+s_{12}} + \frac{1}{\varepsilon_0\varepsilon_b}\right)P_3 + \left(4a_{11} + 4\frac{Q_{12}^2}{s_{11}+s_{12}}\right)P_3^3 + \quad (16)$$

$$6a_{111}P_3^5 - \frac{1}{\varepsilon_0\varepsilon_b L}\int_0^L P_3\,dx_3 - \left(g_{33} + \frac{2f_{12}^2}{s_{11}+s_{12}}\right)\frac{d^2P_3}{dx_3^2} -$$

$$\frac{4Q_{12}f_{12}}{s_{11}+s_{12}}\left(P_3\frac{dP_3}{dx_3}\right) - 2f_{12}u_s\frac{d(s_{11}+s_{12})^{-1}}{dx_3} -$$

$$2\frac{f_{12}}{s_{11}+s_{12}}\frac{du_s}{dx_3} + 2f_{12}Q_{12}P_3^2\frac{d(s_{11}+s_{12})^{-1}}{dx_3} -$$

$$2f_{12}\frac{d(s_{11}+s_{12})^{-1}}{dx_3}\frac{dP_3}{dx_3} + \frac{2f_{12}}{s_{11}+s_{12}}\frac{d(Q_{12}P_3^2)}{dx_3} = 0$$

with boundary conditions:

$$\frac{dP_3}{dx_3} \pm \frac{P_3}{\delta}\bigg|_{x_3=0,L} = 0 \quad (17)$$

where $\delta$ is the extrapolation length and all coefficients are known (Pertsev et al., *Phys. Rev. Lett.* 80, 1988, 1998, Haun et al., *Ferroelectrics* 99, 45, 1989, Eliseev et al., *Phys. Rev. B* 85, 045312, 2012). Due to the lack of $f_{12}$ coefficients in PZT for various compositions in literature, the value of $PZT_{0:8}$ is assumed for all other compositions.

The self-consistent PS method has been employed to model the III-V (Tan et al., *Journal of Applied Physics* 68, 4071, 1990), III-N (King et al., *Physical Review B—Condensed Matter and Materials Physics* 77, 1, 2008) and STO-based heterostructures (Biscaras et al., *Physical Review Letters* 108, 1, 2012, Su et al., *Journal of Applied Physics* 113, 093709, 2013). However, the discrepancy in $n_{ss}$ between experiment and theory, and $n_{ss}$ dependence on temperature T must still be explained.

Incorporating an orbital-resolved effective electron mass $m_e$ and the effect of T, it was found that there is a quantitative agreement of $n_{ss}$ with experiment and theory and this also revealed its independence of T. For a 10 u.c. LAO on STO at T=4.2 K (FIG. 1A), there is a 1.67 eV overlap between the LAO VBM and the STO CBM compared with an intrinsic 6.8 eV potential build-up in LAO. The potential drop indicates electron transfer from the LAO surface to the interface, forming a sheet of electrons $n_{ss}=1.81\times10^{14}$ cm$^{-2}$ and leaving an identical number of holes in LAO to maintain charge neutrality. As a result, the electric field F becomes positive in a portion of the LAO (FIG. 1B), making the LAO potential increase or decrease depending on the polarity of F rather than linearly rising when F is always negative before the electron transfer.

The transferred electrons form an 80 meV band bending in STO (FIG. 1C) where the Fermi level $E_F$ is at −1 meV. There are 1 hole and 4 electron subbands populated above and below $E_F$, respectively, and their wave extensions are longer than the corresponding Fermi wavelength. The electrons are distributed within 3.5 nm where the volume carrier density $n_e$ decays to 1% of its peak value in STO. Consequently, F rapidly decreases to zero from the interface, as does its modulation on the dielectric constant $\in_r$ (inset of FIG. 1C).

Figure 1B:
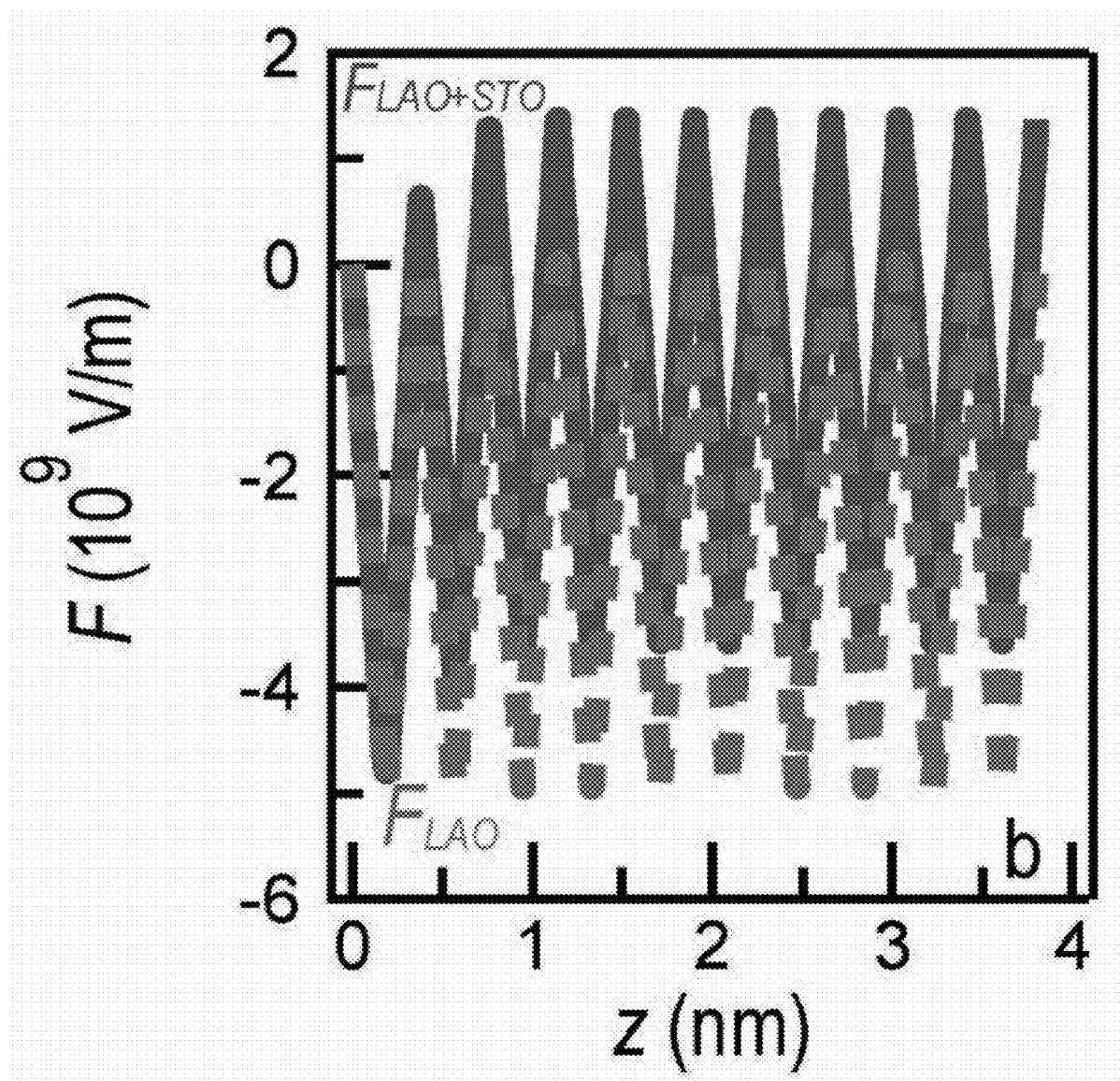
FIG. 1B shows the electric field F in LAO of the compositionally graded ferroelectric film of FIG. 1A.
Figure 1C:
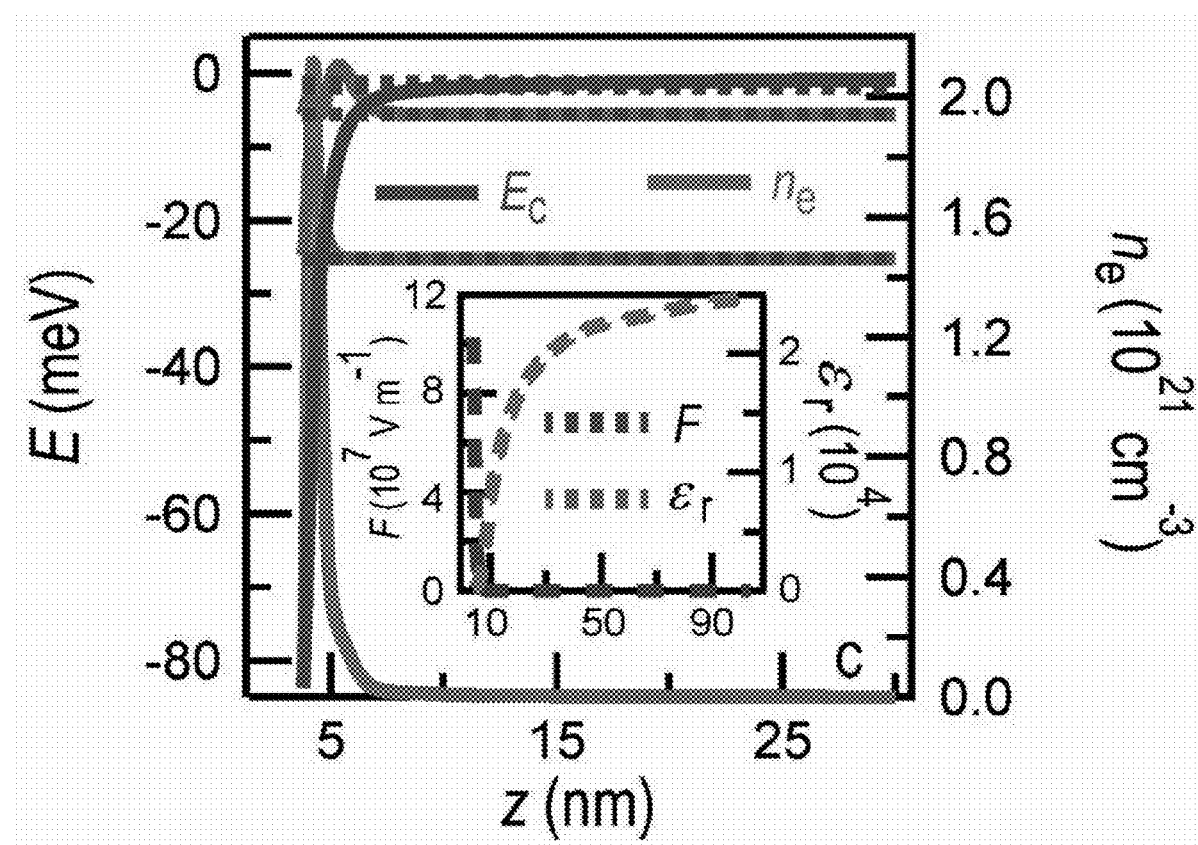
FIG. 1C shows the band bending formed in STO with its subbands, using the compositionally graded ferroelectric film of FIG. 1A.

Particularly, FIG. 1A shows a band profile of a 10 u.c. LAO on STO at T=4.2 K, according to one aspect of this disclosure. The dashed blue and green lines show the intrinsic potential in LAO. The black dashed line is the LAO-STO boundary and the red dashed line is the Fermi level. FIG. 1B shows the electric field F in LAO for both cases in FIG. 1A. FIG. 1C shows the band bending formed in STO with its subbands, the square magnitude of the eigenwaves at the 1st and 2nd levels and the volume carrier density. The inset of FIG. 1C shows F and $\in_r$ in STO.

Figure 2A:
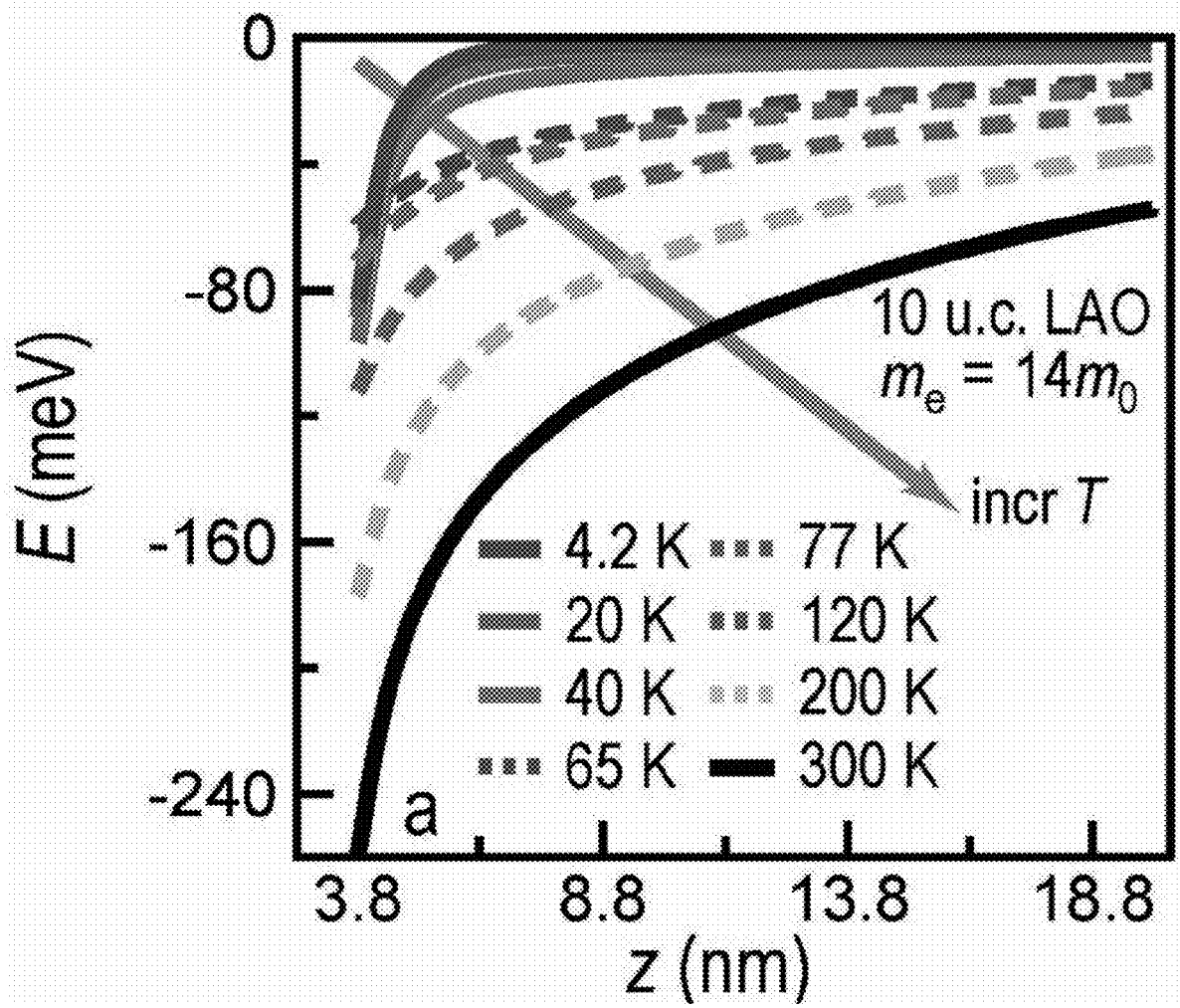
FIG. 2A shows band bending of 10 u.c. LAO for $m_e=14$ $m_0$ and various temperatures in a compositionally graded ferroelectric film according to one aspect of the present disclosure.

Electron localization is ascribed to a heavy $d_{xz}$ orbital where $m_e=14$ $m_0$ (Santander-Syro et al., *Nature* 469, 189, 2011) at low T. Calculations with different $m_e$ and T show the effect of each. In FIG. 2A, when the identical $m_e$ is used, the band bending increases for temperatures up to T=65 K above which $\in_r$ becomes independent of F (Neville et al., *Journal of Applied Physics* 43, 1972). As a result, the integrated F and band bending in the Poisson equation become lower. At above T=65 K the band bending again increases, to 260 meV at 300 K, to counteract the thermal activation of the electrons. However, $n_{ss}$ remains about $1.83\times10^{14}$ cm$^{-2}$ and the electrons are still confined within several nanometers at all temperatures.

Figure 2B:
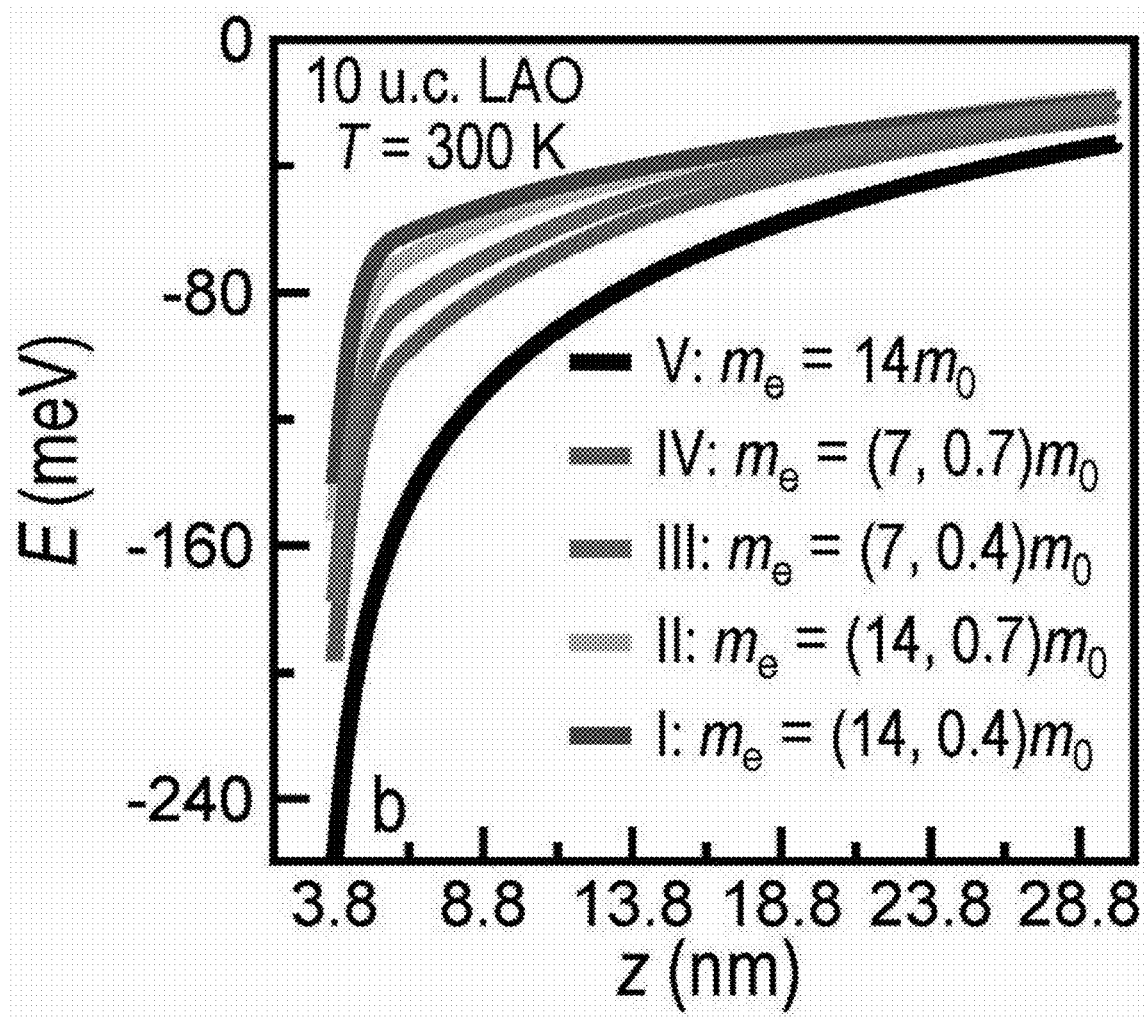
FIG. 2B shows band bending of 10 u.c. LAO for T=300 K and various $m_e$ values in the compositionally graded ferroelectric film of FIG. 2A.

The band bending with different $m_e$ at T=300 K are calculated (FIG. 2B). An orbital-resolved $m_e$ is employed at different distances from the interface. First, let $m_e=14$ $m_0$ to a $d_{yz}$ orbital 0.7 $m_0$ (Santander-Syro et al., *Nature* 469, 189, 2011) and 0.4 $m_0$ (Pentcheva et al., *Physical Review Letters* 104, 2, 2010) at 2 nm away from the interface. The band bending decreases to about 150 meV and 140 meV, respectively, because F, whose first derivative (in the Poisson equation) has a linear dependence on $n_e(m_e)$, is suppressed in the light $m_e$ region and hence the band bending. Then $m_e$ is changed to 7 $m_0$ (Zhong et al., *Physical Review B—Condensed Matter and Materials Physics* 87, 1, 2013) in the heavy $m_e$ region for both cases and the band bending increases to about 200 and 178 meV, respectively, restricting the escape of electrons due to the decrease in $m_e$. Compared with the constant $m_e$, the slopes in the heavy $m_e$ region are much steeper than the light $m_e$ in response to the sharp $m_e$ contrast, but $n_{ss}$ remains ~$1.83\times10^{14}$ cm$^{-2}$ in each case.

These results show that the total $n_{ss}$ approaches the theoretical value $3.3\times10^{14}$ cm$^{-2}$ over a wide T and $m_e$ range and the $n_{ss}$ in the light $m_e$ region yields quantitative agreement with experiment which is usually an order of magnitude smaller.

Figure 2C:
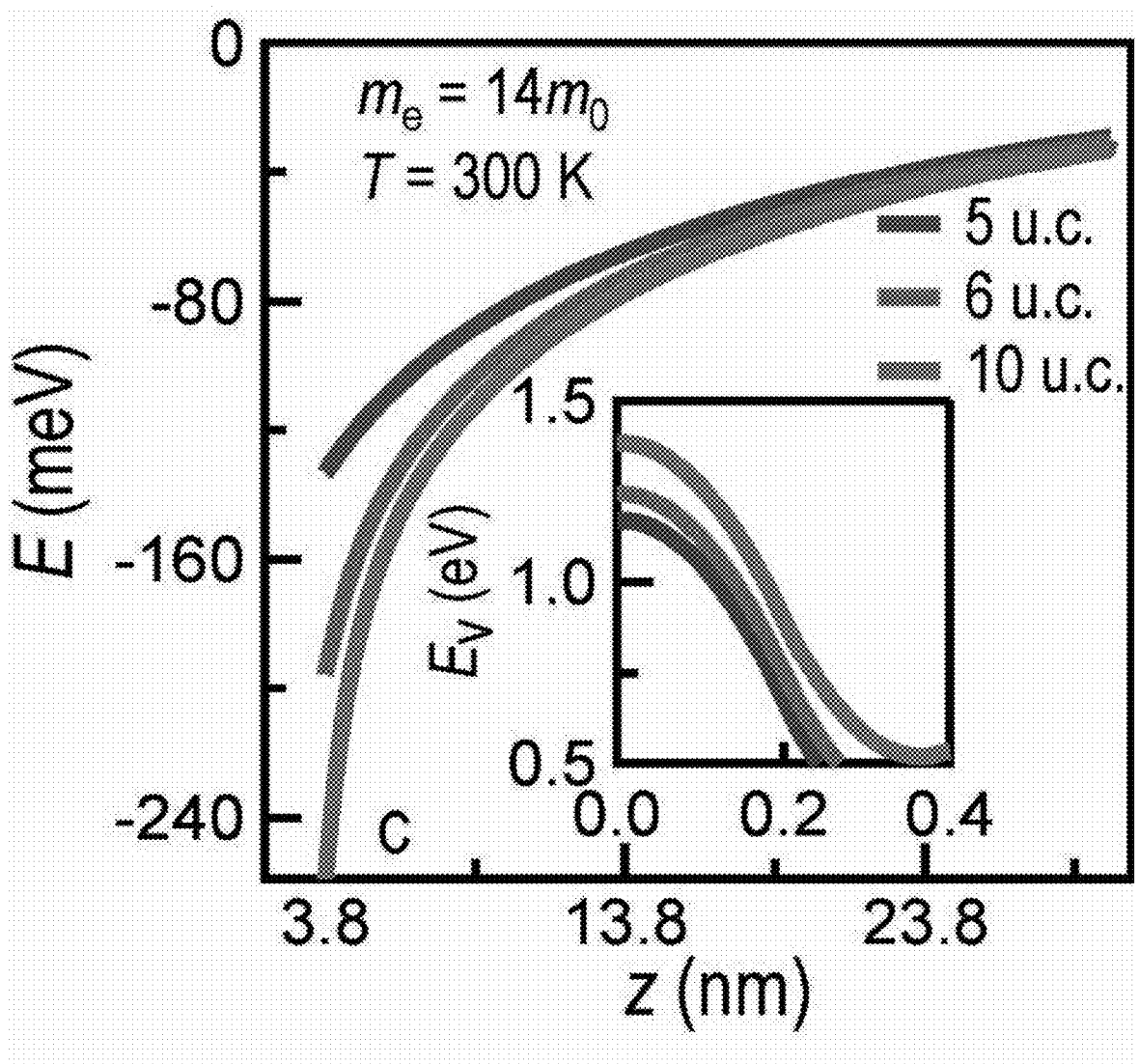
FIG. 2C shows a comparison of E of 5, 6 and 10 u.c. LAO at $m_e=14$ $m_0$ and T=300 K using the compositionally graded ferroelectric film of FIG. 2A.
Figure 2D:
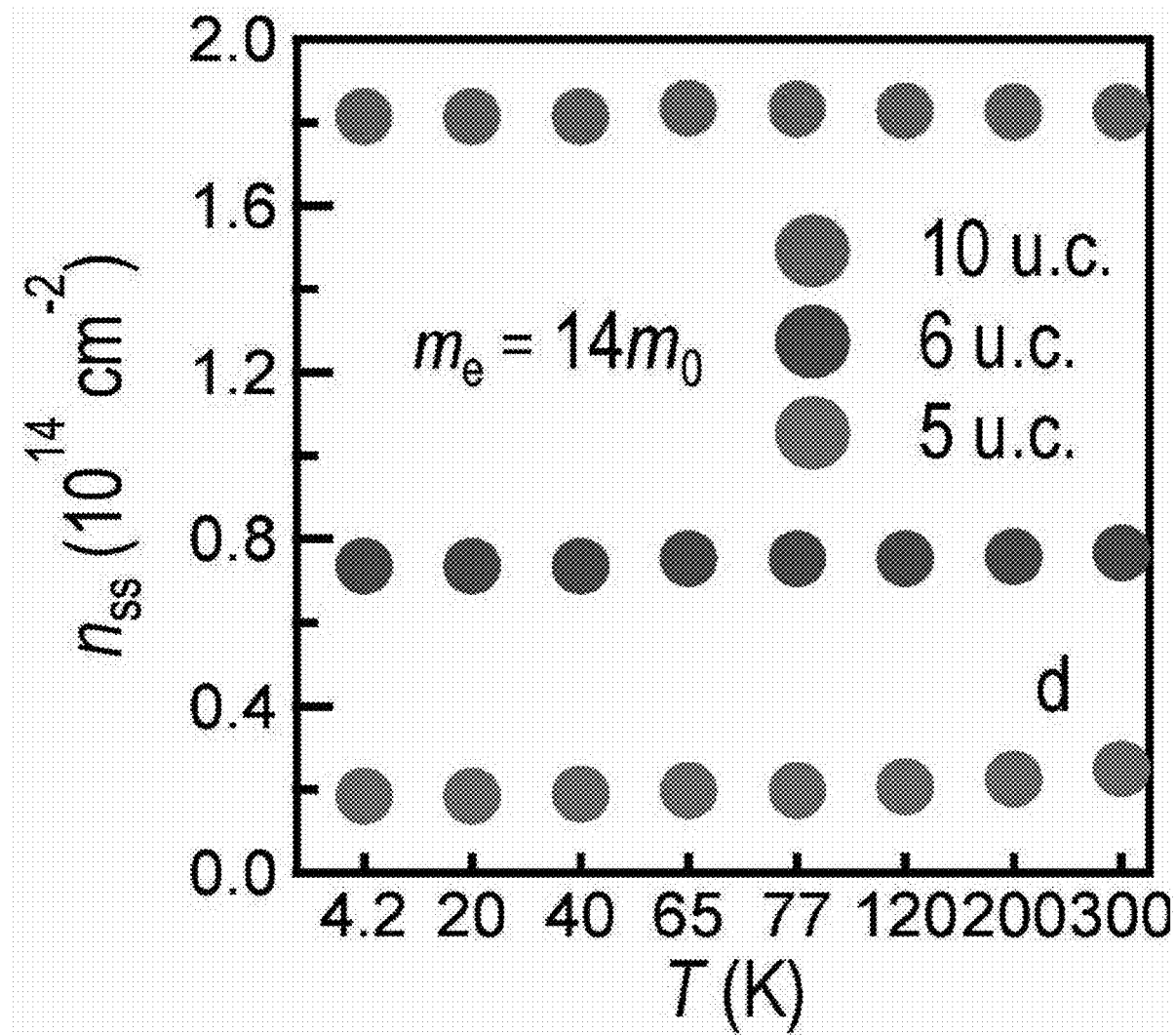
FIG. 2D shows the total $n_{ss}$ of 5, 6 and 10 u.c LAO with $m_e=14$ $m_0$ at different temperatures using the compositionally graded ferroelectric film of FIG. 2A.
Figure 2E:
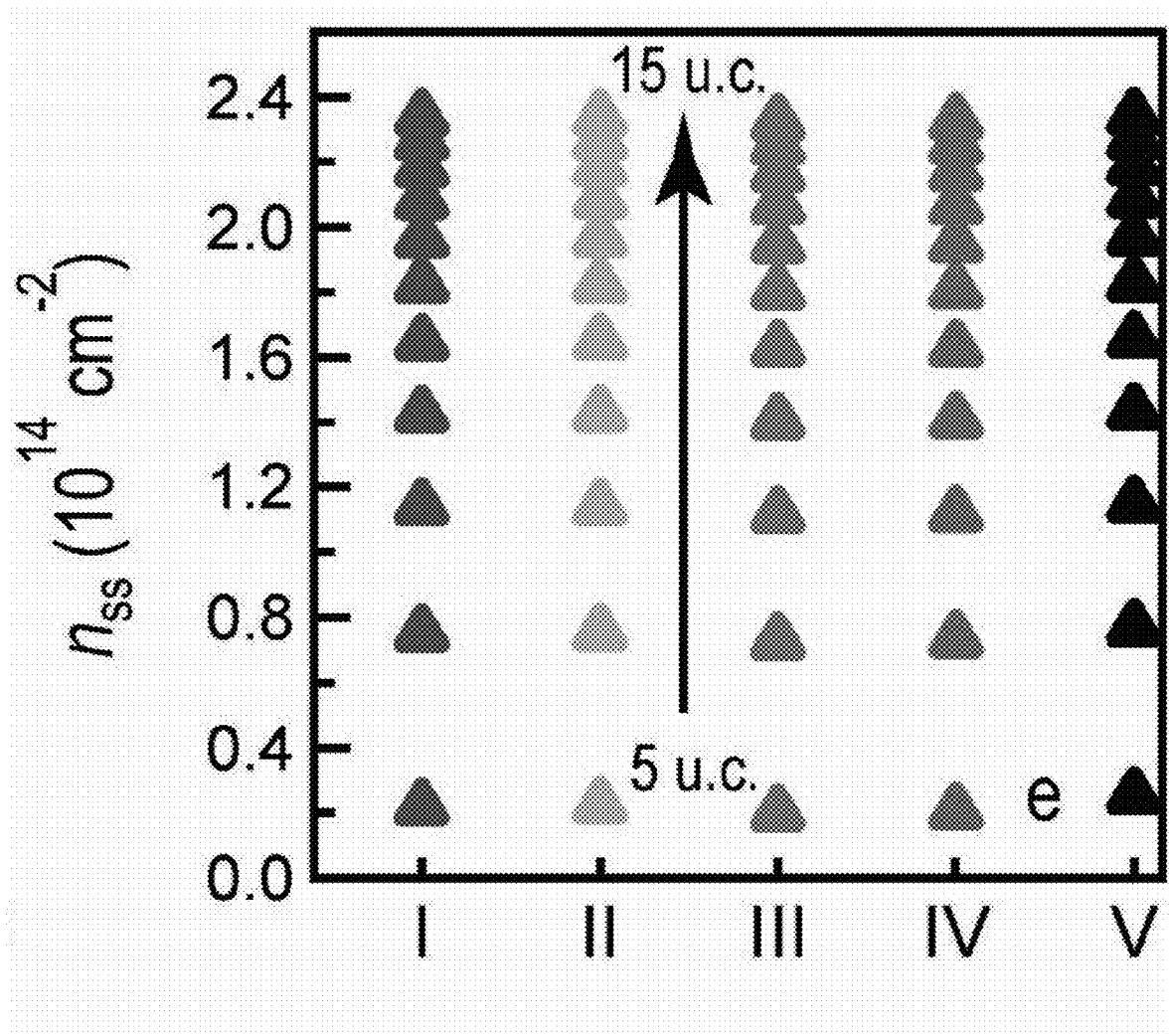
FIG. 2E shows effect on $n_{ss}$ by 5 to 15 u.c. LAO and $m_e$ at T=300 K using the compositionally graded ferroelectric film of FIG. 2A

Though $m_e$ and T have a profound impact on the band bending, $n_{ss}$ and the electron localization are preserved because of the intrinsic potential build-up in LAO, verified by the comparisons of 5 and 6 u.c. LAO at $m_e=14$ $m_0$ and T=300 K (FIG. 2C). The band bending reduces with the LAO u.c. because of less overlap between the LAO VBM and the STO CBM shown in the inset, leading to $n_{ss}=2.5\times10^{13}$ and $7.7\times10^{13}$ cm$^{-2}$. The effects of T and me on $n_{ss}$ are shown in FIGS. 2D and 2E where $n_{ss}$ stays unchanged over a wide range of T and in all orbital-resolved $m_e$ cases, and $n_{ss}$ increases from $2.5\times10^{13}$ for 5 u.c., to $2.3\times10^{14}$ cm$^{-2}$ for 15 u.c., approaching the theoretical value. The discrepancy between the calculated and experimental $n_{ss}$ could be addressed by counting $n_{ss}$ with orbital-resolved $m_e$ shown in FIG. 2F. $n_{ss}$ in the light $m_e$ region corresponding to IV in FIG. 2B increases from $6.9 \times 10^{12}$ for 5 u.c. to $2.0 \times 10^{13}$ cm$^{-2}$ for 15 u.c. (Thiel et al., *Science* 313, 1942, 2006). Also, the ratio between $n_{ss}$ in the light $m_e$ region and the total increases as the difference between heavy and light $m_e$ is reduced.

Figure 2F:
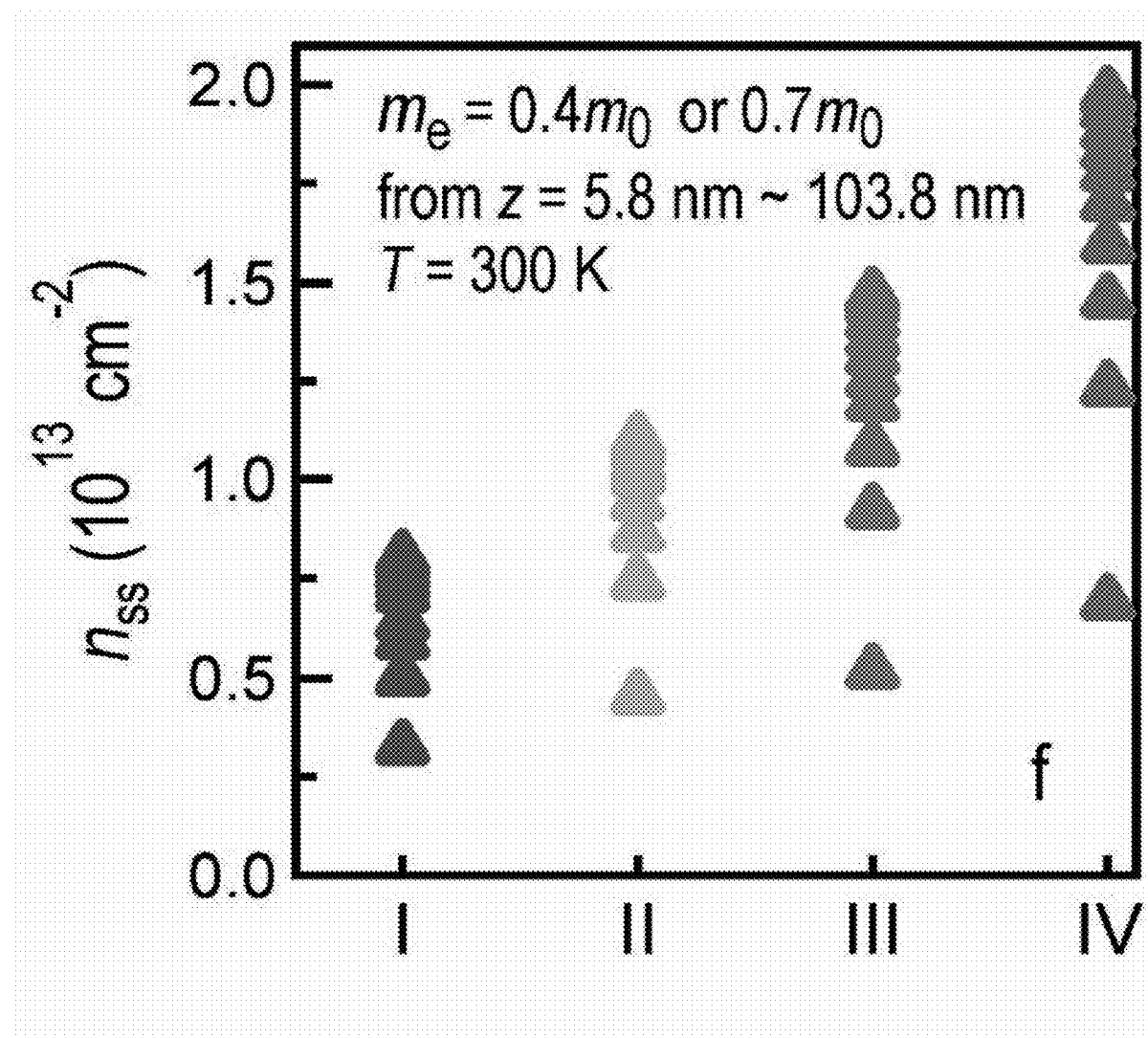
FIG. 2F shows the change of $n_{ss}$ at and $m_e$ T=300 K using the compositionally graded ferroelectric film of FIG. 2A

In summary, FIGS. 2A-2F show band bending of 10 u.c. LAO for:
a. $m_e = 14$ $m_0$ and various T (FIG. 2A).
b. T=300 K and various $m_e$. The heavy $m_e$ region is defined as being from z=3.8 nm to 5.8 nm and the light from z=5.8 nm. The values of $m_e$ in the two regions in I, II, III, IV are shown in the inset (FIG. 2B).
c. The comparison of 5, 6 and 10 u.c. LAO at $m_e = 14$ $m_0$ and T=300 K and the LAO VBMs shown in the inset (FIG. 2C).
d. the total $n_{ss}$ of 5, 6 and 10 u.c LAO with $m_e = 14$ $m_0$ at different T (FIG. 2D).
e. 5 to 15 u.c. LAO at T=300 K and $m_e$ in I, II, III, IV and V in FIG. 2B (FIG. 2E).
f. $n_{ss}$ at T=300 K and $m_e$ in the light $m_e$ region in I, II, III and IV in FIG. 2B (FIG. 2F).

Figure 3A:
FIG. 3A shows a single-composition PZT0:8 film, according to one aspect of the present disclosure.
Figure 3B:
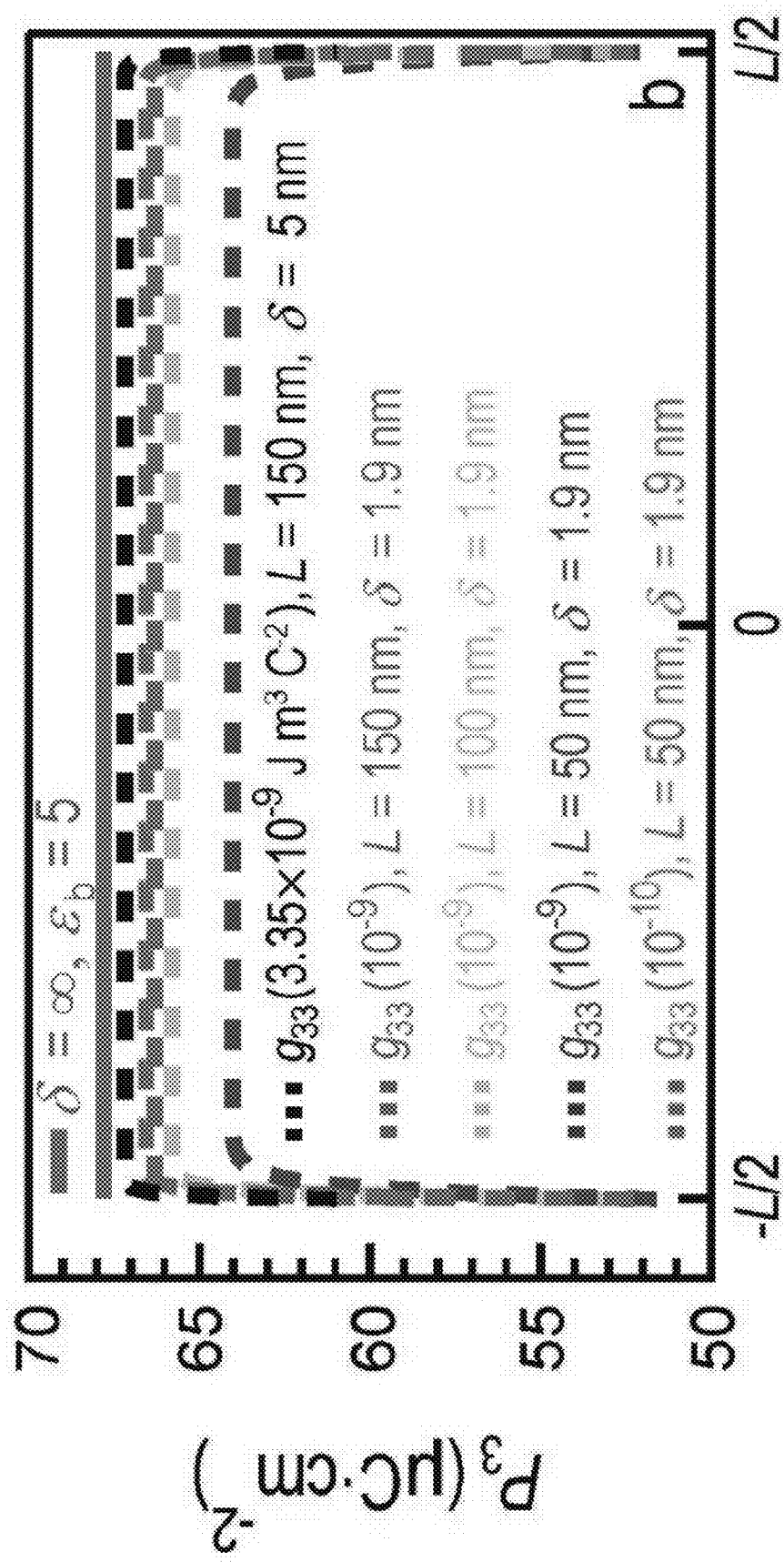
FIG. 3B shows a $P_3$ profile of the compositionally graded ferroelectric film of FIG. 3A.
Figure 3C:
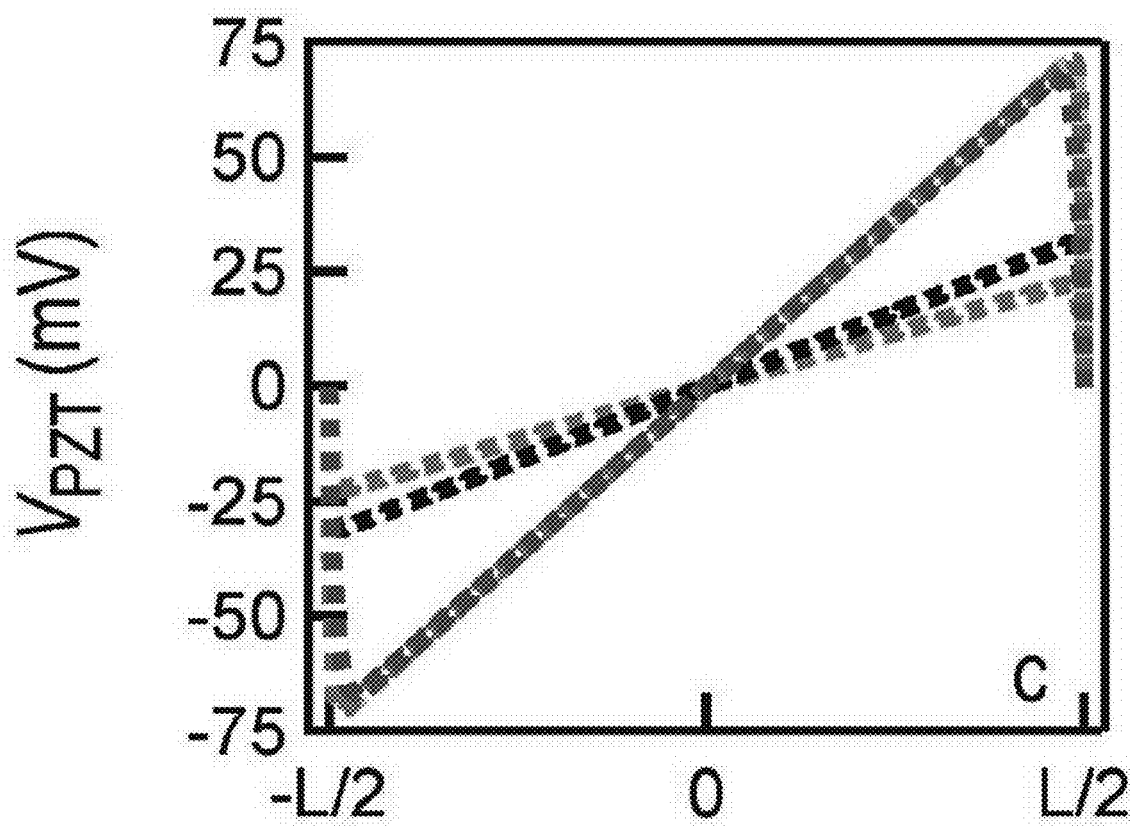
FIG. 3C show potential variations $V_{PZT}$ of the compositionally graded ferroelectric film of FIG. 3A.
Figure 3D:
FIG. 3D shows a graded PZT0:2~PZT0:8 film according to one aspect of the present disclosure.
Figure 3E:
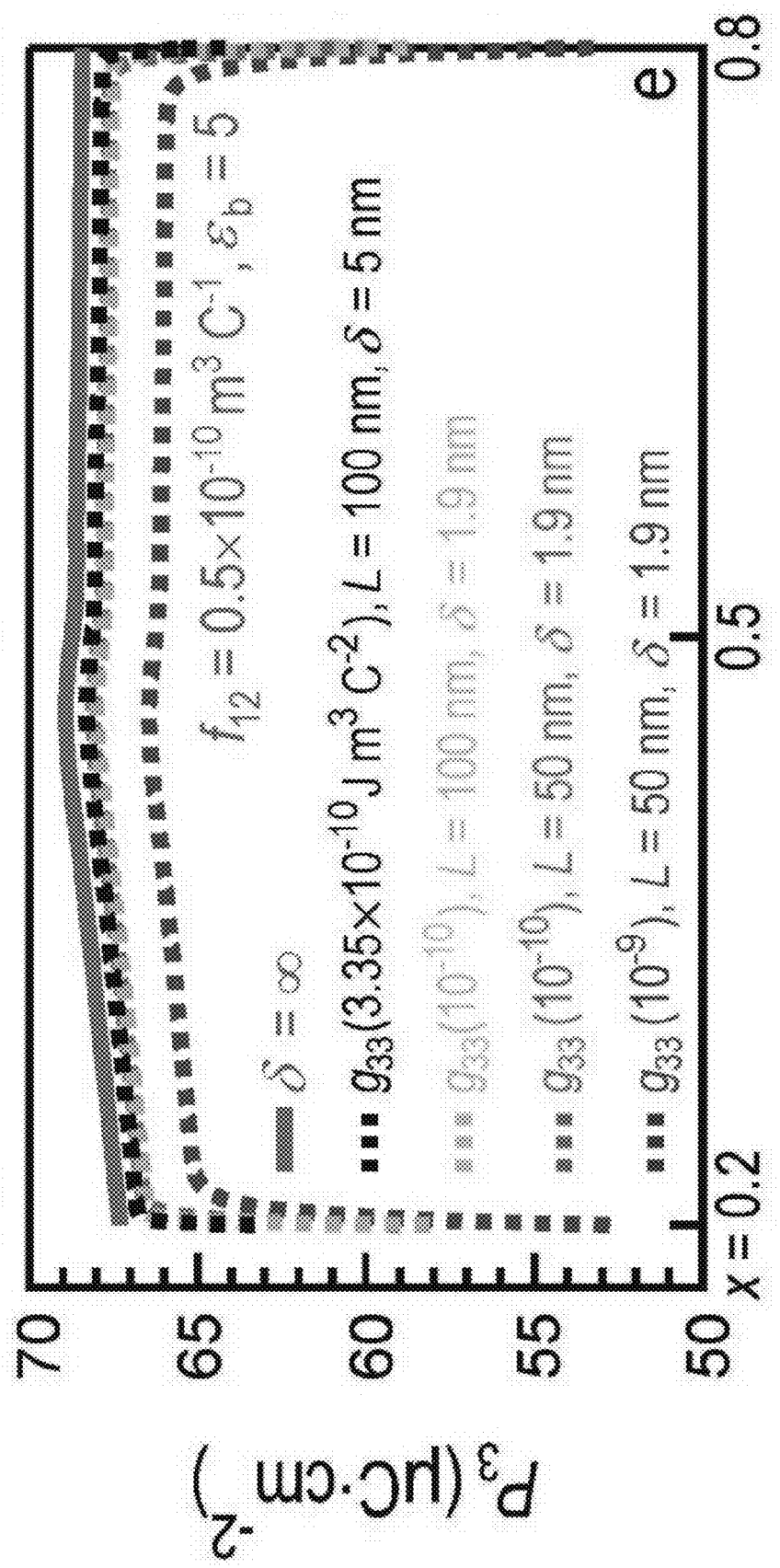
FIG. 3E shows a $P_3$ profile of the compositionally graded ferroelectric film of FIG. 3A.
Figure 3F:
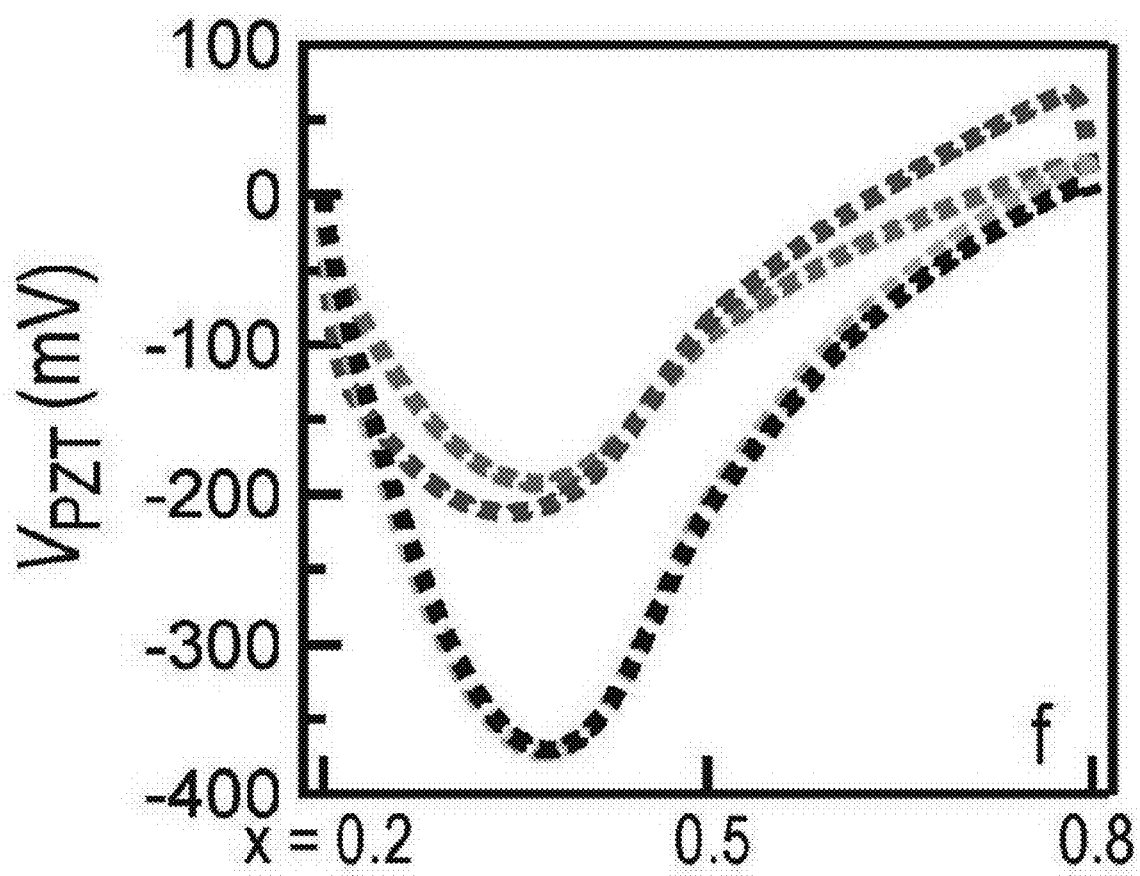
FIG. 3F shows potential variations $V_{PZT}$ of the compositionally graded ferroelectric films of FIG. 3D.

Two exemplary ferroelectric films: a PZT$_{0:8}$ film and a graded PZT$_{0:2}$~PZT$_{0:8}$ film, are shown in FIGS. 3A and 3D respectively. The $P_3$ profiles of the single-composition PZT$_{0:8}$ film and graded PZT$_{0:2}$~PZT$_{0:8}$ film are shown in FIG. 3B and FIG. 3E respectively. The corresponding potential variations $V_{PZT}$ of respective films of the films of FIGS. 3A and 3D are shown in FIGS. 3C and 3F.

Using values of $m_e$ obtained from previous studies (Pentcheva et al., *Physical Review Letters* 104, 2, 2010, Zhong et al., *Physical Review B—Condensed Matter and Materials Physics* 87, 1, 2013, Son et al., *Physical Review B* 79, 1, 2009) and advanced experimental spectroscopies (Santander-Syro et al., *Nature* 469, 189, 2011), the PS solution can be used to model and explain the band bending and $n_{ss}$ over a wide range of T, yielding quantitative agreement with theoretical and experiment values. Regardless of $n_{ss}$, the mobility $\mu$ of STO-based system is dominated by the longitudinal optical phonon scattering (Verma et al., *Physical Review Letters* 112, 1, 2014, Mikheev et al., *Applied Physics Letters* 106, 062102, 2015) at 300 K. In fact, $\mu_{LO}$ shows $m_e^{-3}$ dependence and is calculated to be $4 \times 10^{-3}$, $5 \times 10^{-2}$ and 36.6 cm$^2$/Vs corresponding to $m_e = 14$ $m_0$, 7 $m_0$, and 0.7 $m_0$, respectively, at 300 K. Though the heavy-$m_e$ electrons occupies a large fraction in the total, their contribution to the conductivity $\sigma = q\mu n_e$ is inhibited by the much lower mobility.

The phonon mobility $\mu_{lo}$ at room temperature is characterized as $$\mu_{LO} = \frac{hq}{2\alpha m p l i \omega_{LO}} \left(\frac{m_e}{m_P}\right)^2 f(\alpha)(e^{\hbar\omega_{LO}/k_B T} - 1) \quad (8)$$

where $\mu_{LO}$, $m_P$ and $\alpha$ are the LO frequency, polaron mass and electron-phonon coupling constant (Low and Pines, *Phys. Rev.* 98, 414, 1955). $f(\alpha)$ is smoothly increasing from 0 to 1.5 when $0 < \alpha < 8$ and $m_P = (1 + 0.125\pi\alpha + 0.1272\alpha^2)m_e$ (Peeters et al., *Phys. Rev. B* 37, 933, 1988). The three LO modes in STO are 99, 58 and 22 meV (Eagles et al., *Journal of Physics and Chemistry of Solids* 26, 672, 1965), and the corresponding $\alpha$ are $$1.83\left(\frac{m_e}{m_o}\right)^{\frac{1}{2}}, 0.5\left(\frac{m_e}{m_o}\right)^{\frac{1}{2}} \text{ and } 0.001\left(\frac{m_e}{m_o}\right)^{\frac{1}{2}}.$$

Polarization profiles of PZT$_{0:8}$ films (FIG. 3A) with different gradient energy coefficients $g_{33}$, extrapolation lengths $\delta$ and L are shown in FIG. 3B. Spontaneous $P_3$ with $\delta$=inf is 68 C/cm$^2$. For a realistic value of $\delta$(=1.9 nm) (Jia et al., *Nature materials* 6, 64, 2007), $P_3$ decreases near the surface and interface, and maintains uniformity in the middle. This film profile in P is dependent on $g_{33}$ and L. For example, for a 50 nm-thick film, $V_{PZT}$ increases from 22 meV to 67 meV when $g_{33}$ changes from $3.46 \times 10^{-10}$ to $3.46 \times 10^{-9}$ m$^3$VC and saturates at 71 meV when L=150 nm or thicker. However, it drops to 31 meV when $\delta$ increases from 1.9 to 5 nm (FIG. 3C). Since $g_{33}$ and $\delta$ are largely dependent on the as-grown property of the film, $V_{PZT}$ in a single-composition film is limited by thickness and varies extensively with growth conditions. These two shortages could strongly affect the modulation effect, but can be overcome by a compositionally-graded film (Agar et al., *ACS Nano* 9, 7332, 2015) where $V_{PZT}$ is dependent on the composition gradient and increases with L.

The $P_3$ of a graded film whose composition smoothly varies from PZT$_{0:2}$ to PZT$_{0:8}$ (FIG. 3D) is shown in FIG. 3E. Unlike the single-composition, $P_3$ in the middle varies with composition and hence the potential drops near the top and bottom of the film are dominated by that in the interior through the relatively large L/$\delta$ ratio (FIG. 3F). $V_{PZT}$ increases to 192 meV and 212 meV for a 50 nm film with different pairs of values of $g_{33}$, 3 to 8 times larger than that for single-composition PZT$_{0:8}$, and it continues to increase, to 372 meV for L=100 nm, regardless of $\delta$. The weak dependence of $V_{PZT}$ on $g_{33}$ and on $\delta$, combined with its steady increase with L make the graded film a better choice over the single composition.

Figure 4A:
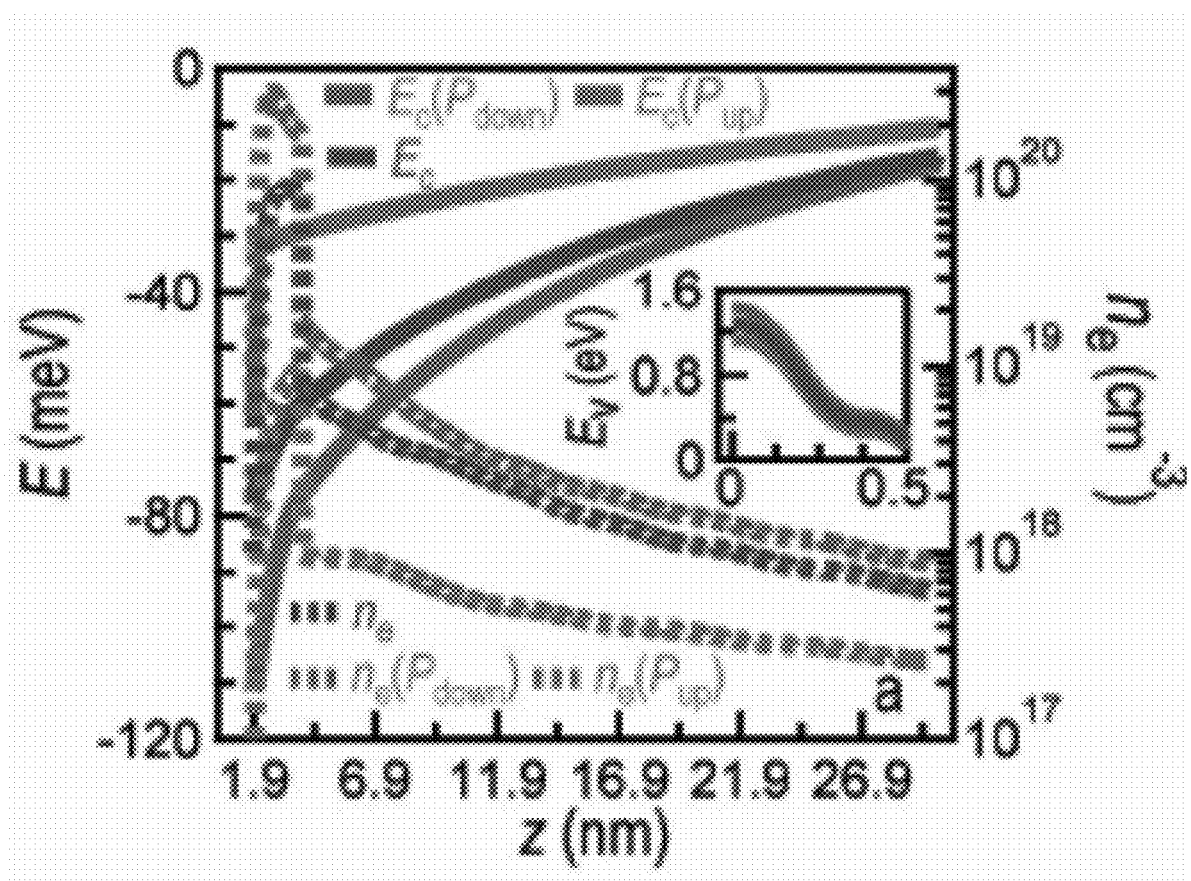
FIG. 4A shows band bending and $n_e$ in a 5 u.c. LAO ($m_e=7$ and 0.7 $m_0$) at T=300 K of compositionally graded ferroelectric films according to one aspect of the present disclosure.
Figure 4B:
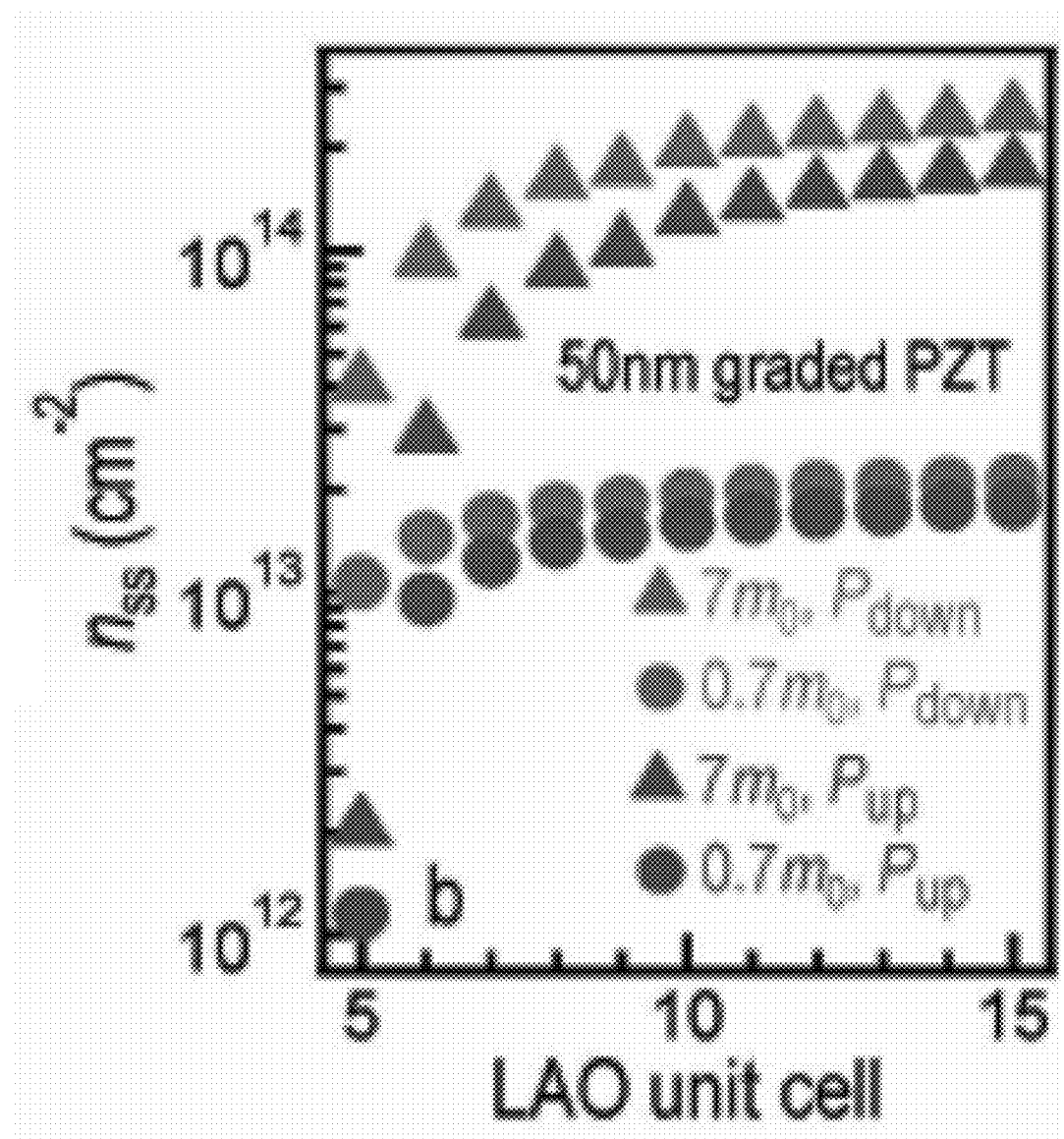
FIG. 4B shows $n_{ss}$ corresponding to the heavy and light $m_e$ regions in the compositionally graded ferroelectric films of FIG. 4A.
Figure 4C:
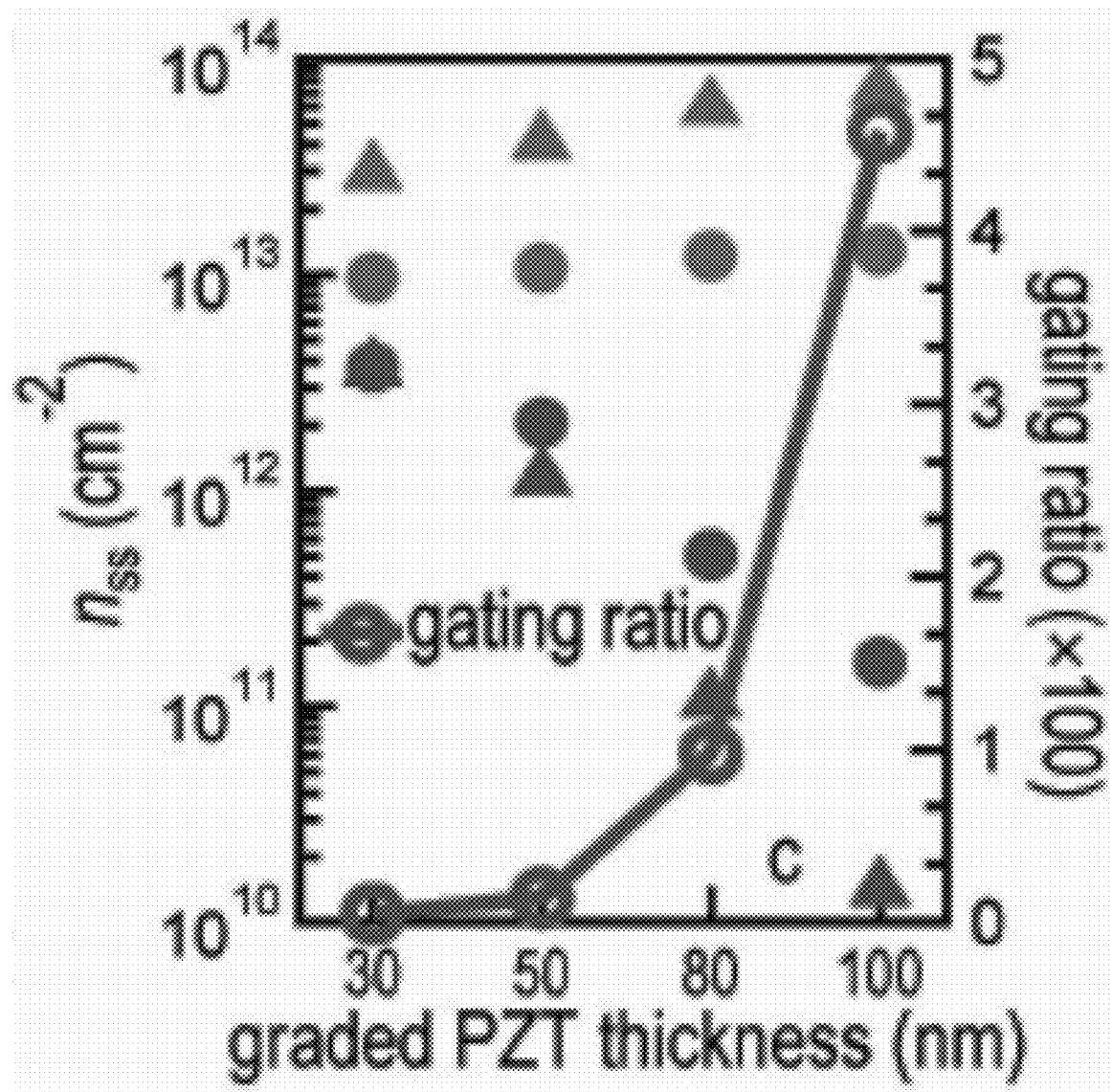
FIG. 4C shows the gating ratio of 5 u.c LAO with different PZT thicknesses in the compositionally graded ferroelectric films of FIG. 4A.
Figure 6A:
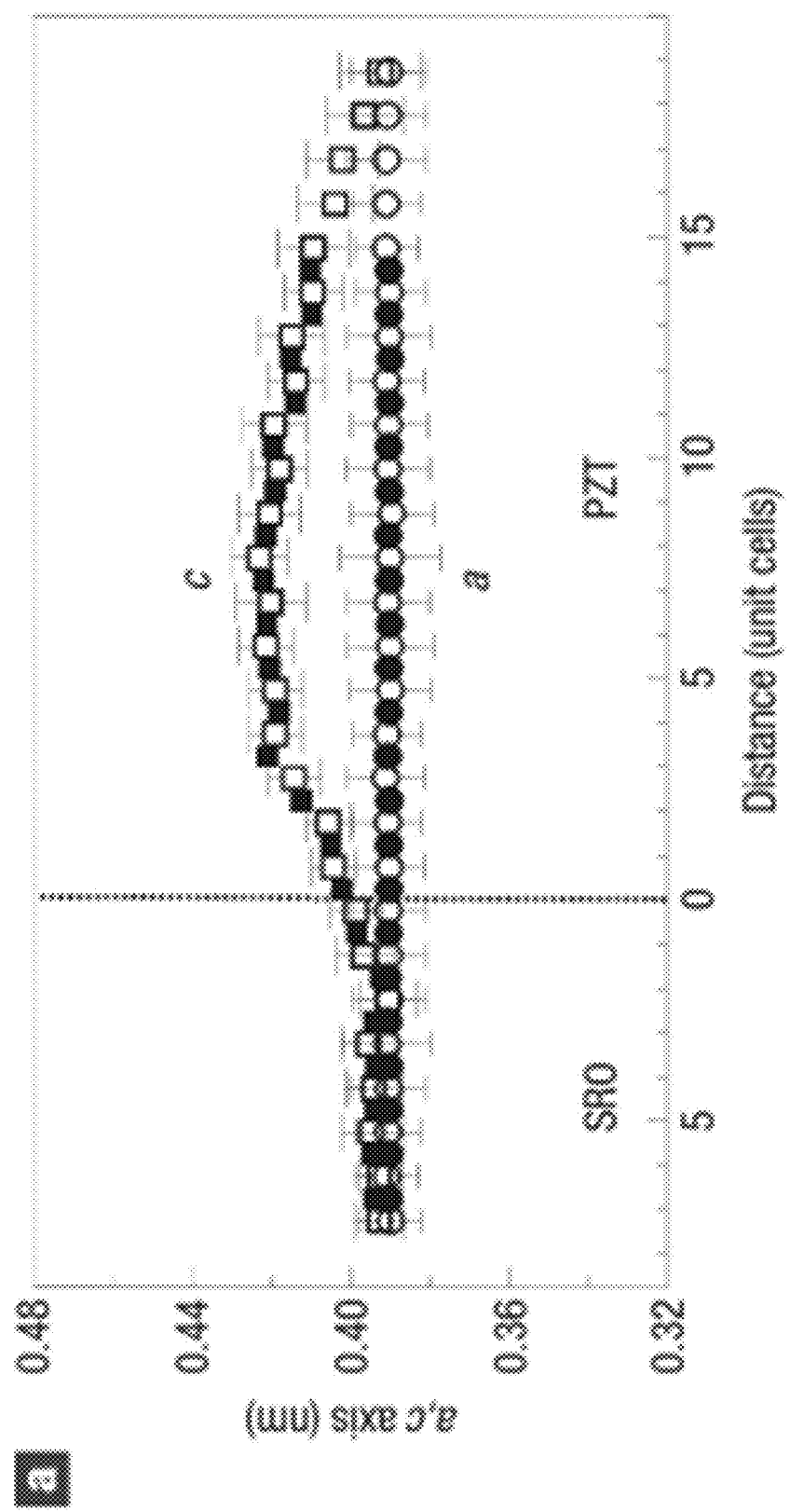
FIG. 6A shows a quantitative comparison between the experimental and calculated data of the images of FIG. 5A-5B. The c and a axes are lattice parameters. Open symbols denote the experimental measurements (the error bars mark the 95% confidence level with respect to the mean values). Filled symbols denote calculated values.
Figure 6B:
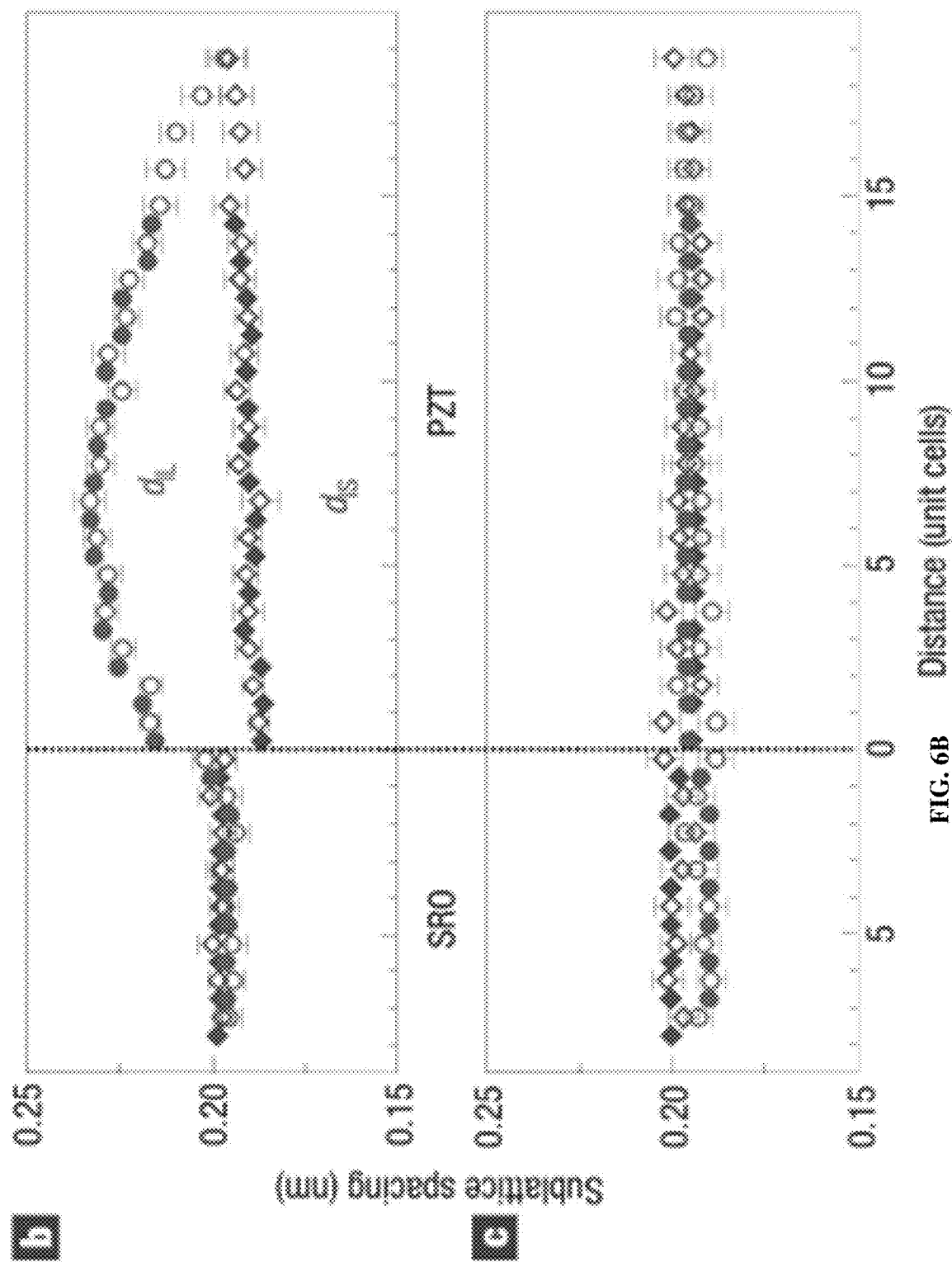
FIG. 6B shows another quantitative comparison between the experimental and calculated data of images of FIG. 5A-5B. The raw data for the shift parameters dIL and dIS as measured (open symbols) and calculated (filled symbols) are presented in the upper panel. The horizontal component of the Sr—Ru (Pb—Zr/Ti) and Ru—Sr (Zr/Ti—Pb) distances (open squares and circles) are compared with the calculated values (filled symbols) in the lower panel.
Figure 7A:
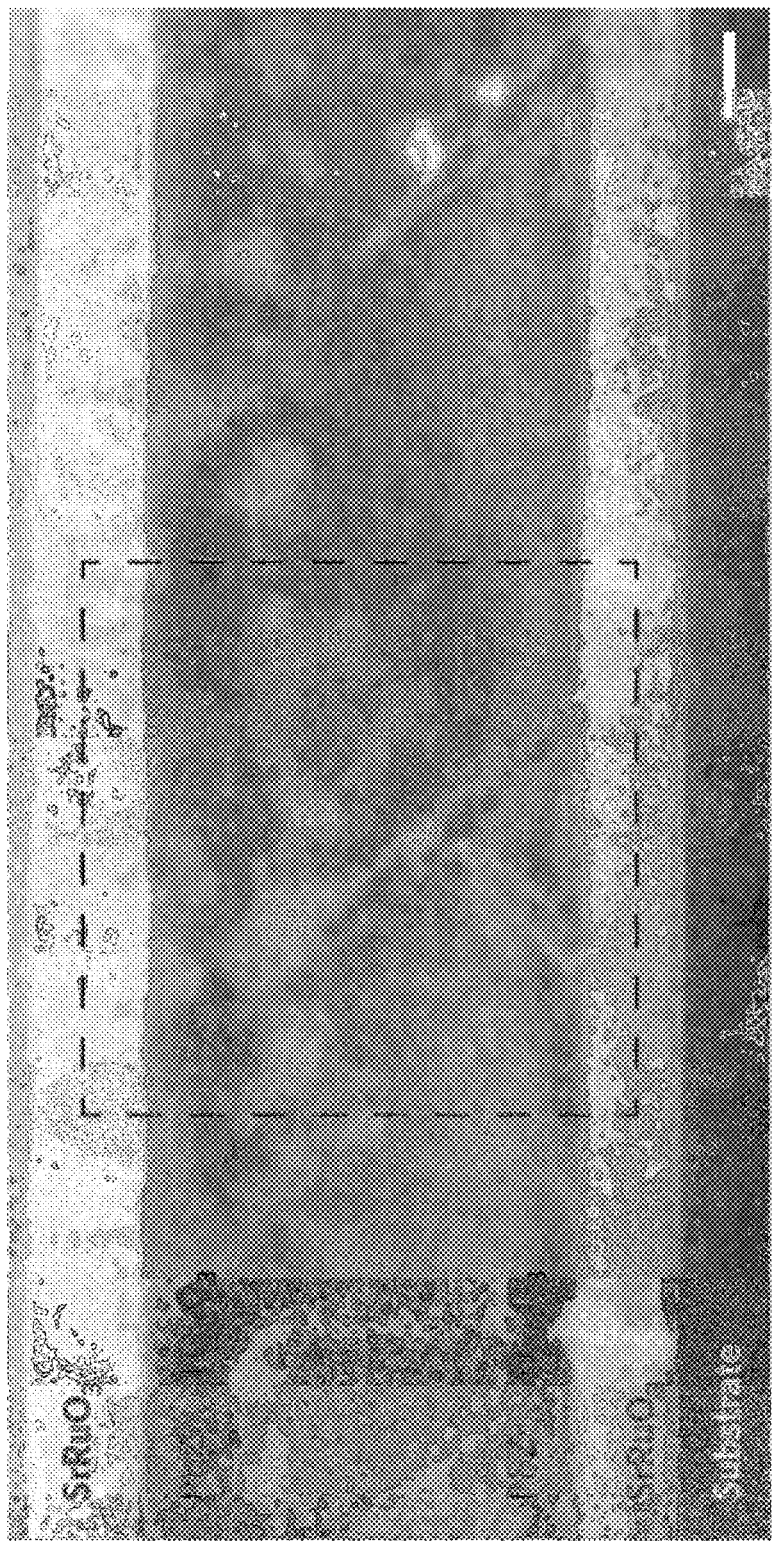
FIG. 7A is a high-angle, angular dark-field scanning transmission electron microscopy image of a compositionally graded heterostructure revealing the presence of ferroelastic domains with needle-like shapes.
Figure 7B:
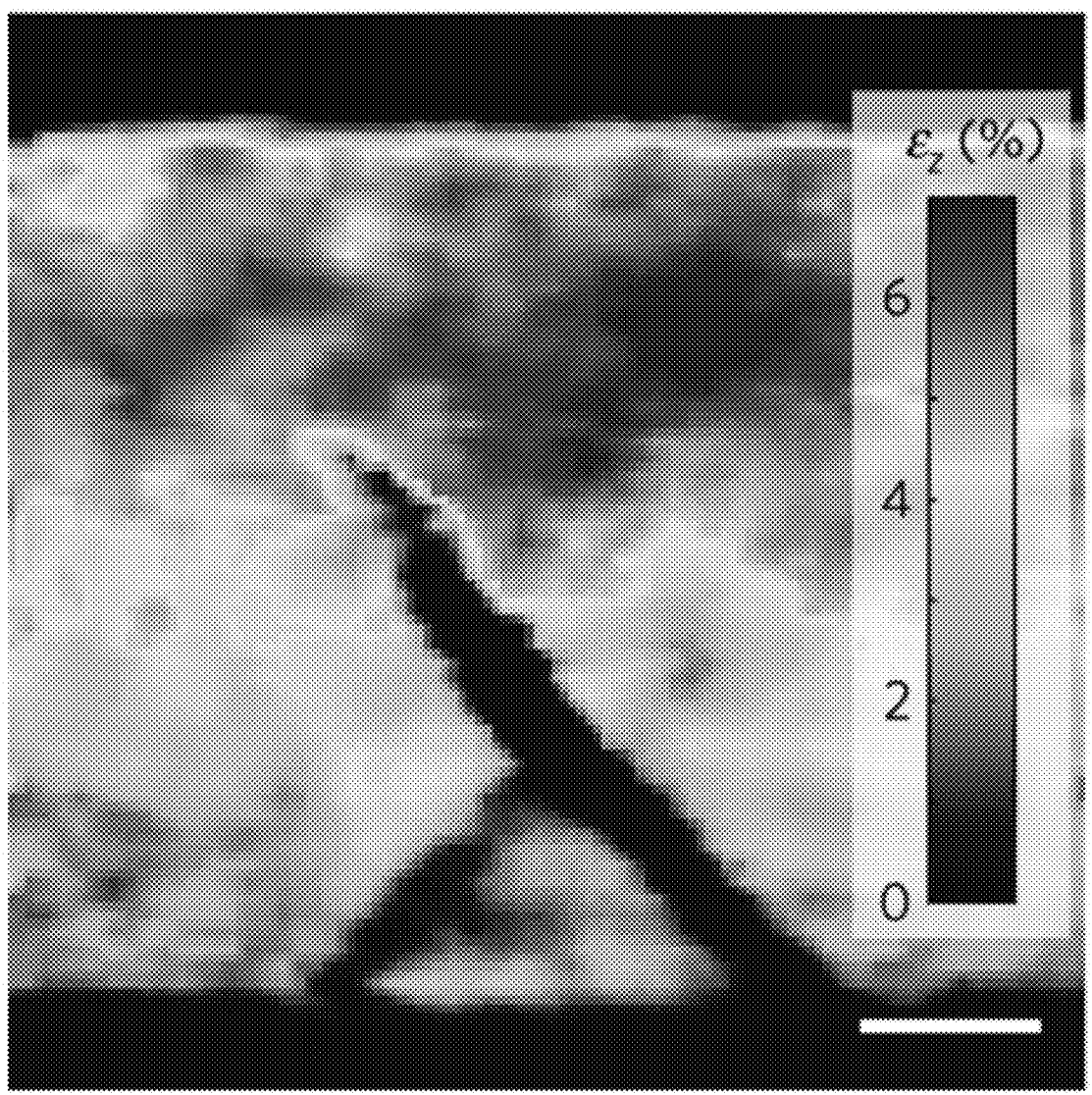
FIG. 7B is a nanobeam diffraction-based strain map of compositionally graded heterostructures that shows the out-of-plane of the film. The scale bar is 25 nm.
Figure 7C:
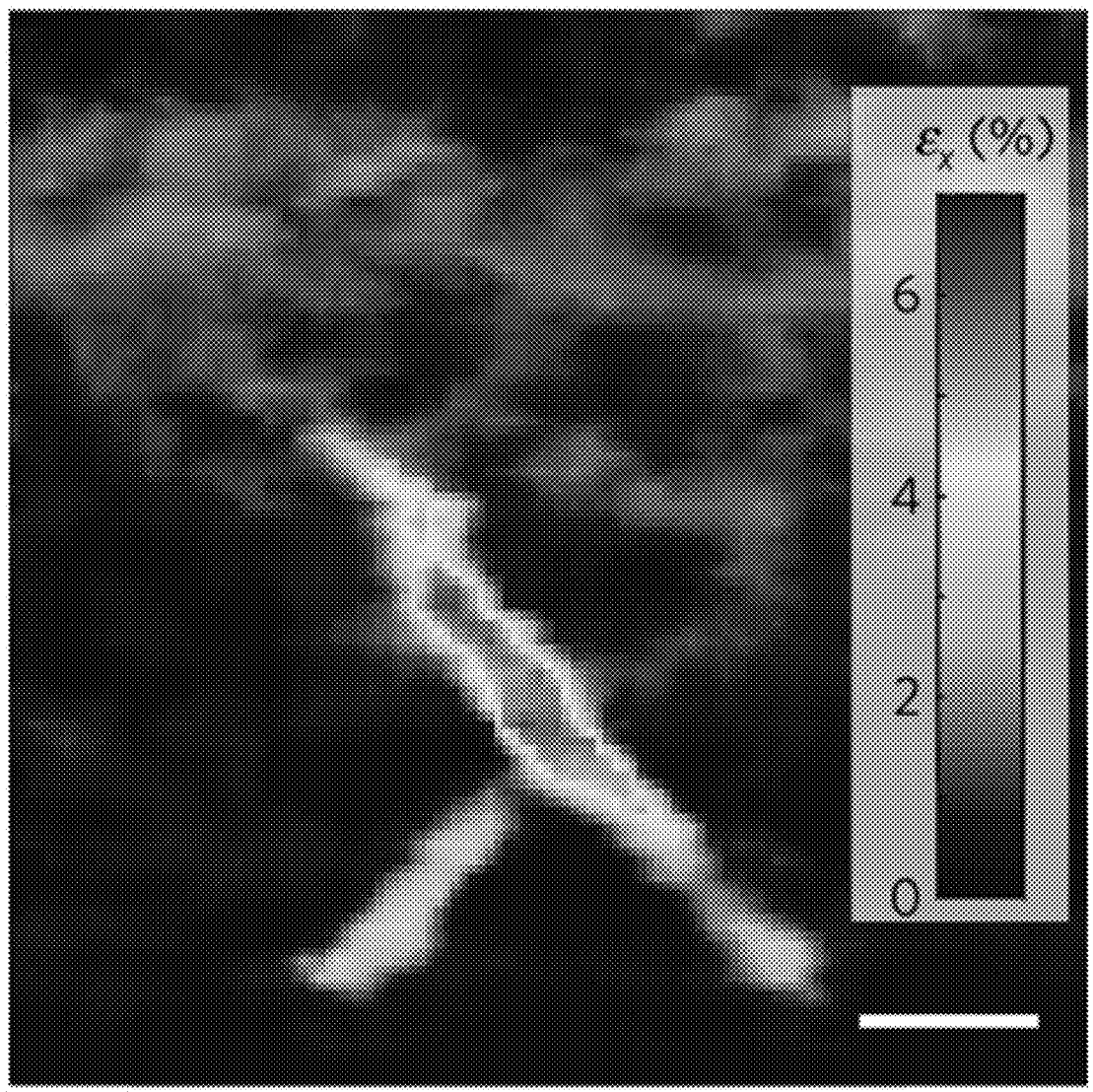
FIG. 7C is a nanobeam diffraction-based strain map of compositionally graded heterostructures that shows the in-plane of the film. The scale bar is 25 nm.
Figure 7D:
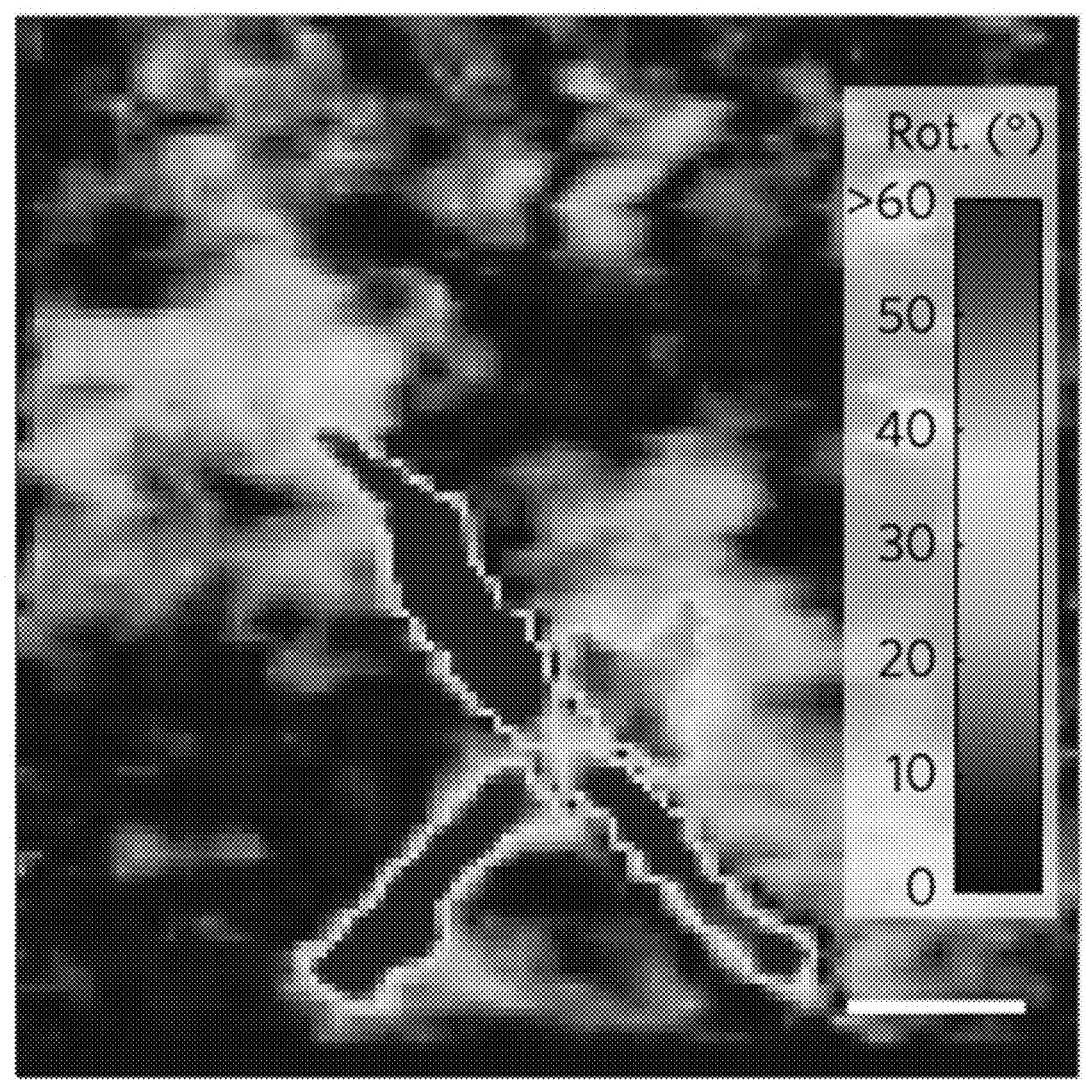
FIG. 7D is a nanobeam diffraction-based strain map of compositionally graded heterostructures that shows the strain state of the film. The scale bar is 25 nm.
Figure 7E:
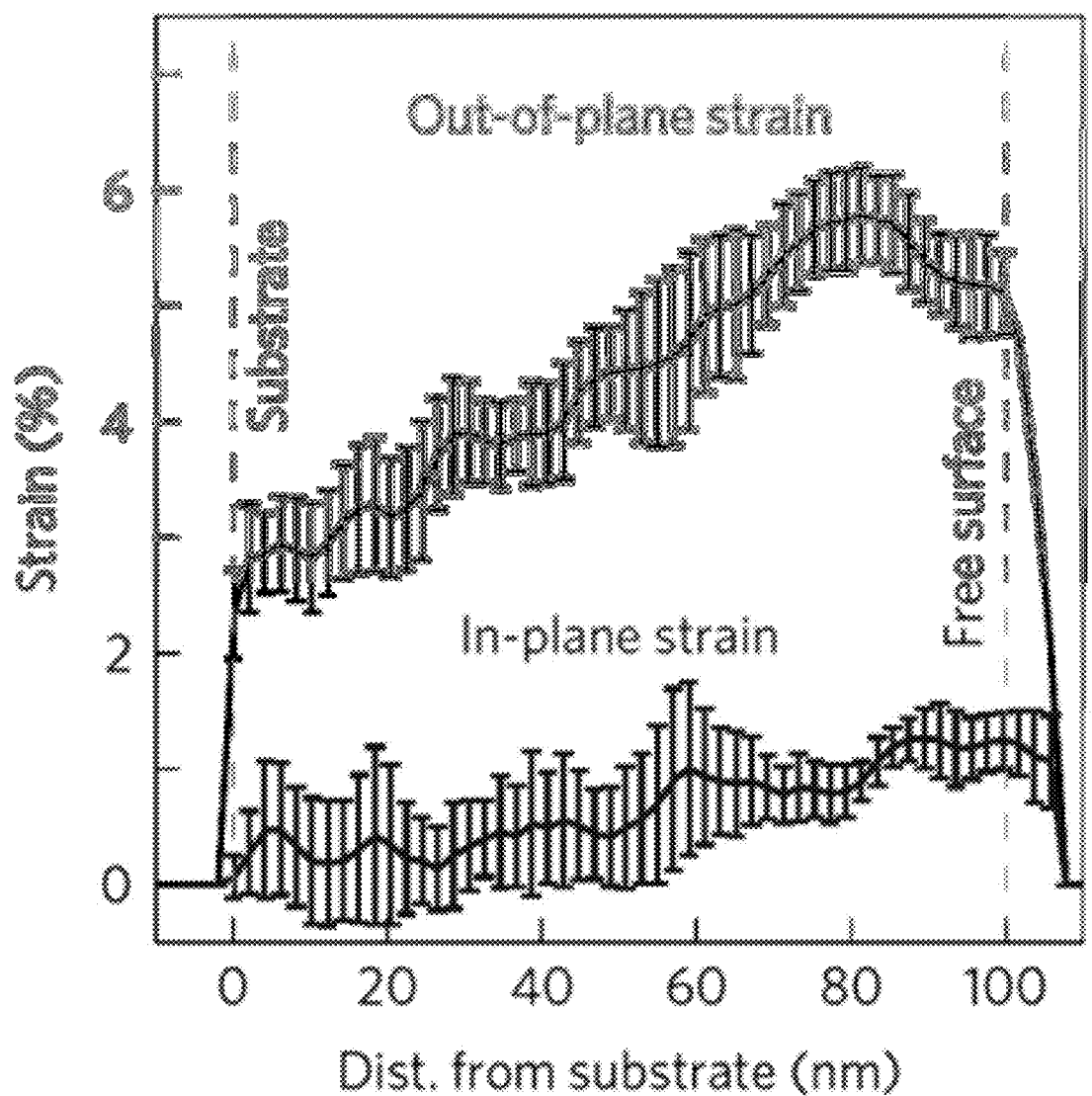
FIG. 7E is a plot that shows the thickness-dependent, average in-plane and out-of-plane strain calculated from the nanobeam diffraction strain map.

The doping effect of a 50 nm-thick graded PZT layer on a 5 u.c. LAO/STO with heavy $m_e = 7$ $m_0$ and light 0.7 $m_0$ at T=300 K is shown in FIG. 4A. The modified band bendings and the LAO VBMs in the inset are 32 meV and 1.13 eV, respectively, for upward $P_3$, and 112 meV and 1.44 eV, respectively, for downward $P_3$. Compared with the intrinsic values (77 meV and 1.28 eV), the LAO and STO overlapping is tuned to be 192 meV shallower and deeper to balance $V_{PZT}$ in upward and downward $P_3$. $n_{ss}$ in the heavy and light $m_e$ regions are $4.1 \times 10^{13}$ cm$^-$ and $1.1 \times 10^{13}$ cm$^{-2}$, respectively, for downward $P_3$, and $2 \times 10^{12}$ cm$^{-2}$ and $1.2 \times 10^{12}$ cm$^{-2}$, respectively, for upward $P_3$. The doping increment is diminished by increasing LAO thickness (FIG. 4B) where it is seen that a thinner LAO is always desired to achieve a better doping effect. The doping effect was investigated as a function of the graded PZT thickness on a 5 u.c. LAO: the splitting of $n_{ss}$ between upward and downward $P_3$ in both the heavy and light $m_e$ region is enhanced with the graded PZT layer (FIG. 4C).

The doping effect is described in Gu et al. (*Applied Physics Letters*, 107, 162901, 2015). Specifically, the doping effect is evaluated as the ratio of the conductivity $\sigma$ of LAO/STO 2DEG in on- and off-states. The ratio may be enhanced by a) increasing the graded PZT thickness, b) using a steeper Zr:Ti variation of the graded PZT layer, and/or c) using a thinner LaAlO$_3$ overlayer on top of SrTiO$_3$. The maximal doping effect may be achieved using a graded PZT composition in the range of from PbZr$_{0.8}$Ti$_{0.2}$O$_3$ to PbZr$_{0.2}$Ti$_{0.8}$O$_3$, setting a 5 unit cell (u.c.) LAO, and simulating the graded PZT film with a 30 nm, 50 nm, 80 nm and 100 nm on LAO/STO channel. The gating ratio in $\sigma$ may be up to about 460, as shown in FIGS. 4A-4C.

The conductivity $\sigma = q\mu n_e$ as a summation in both the heavy and light $m_e$ region where a weighting factor of $n_e(z)/\Sigma n_e(z)$ imposed at each $n_e(z)$ and the gating ratio defined as the ratio of σ between $P_3$ down and up is increasingly steeper, reaching about 500 for a 100 nm-graded film. As long as the smooth transition in PZT composition can be realized in thicker graded films, $V_{PZT}$ can be tuned to higher values as discussed earlier and more modulation of the overlapping of the LAO VBM with the STO CBM can be achieved so that higher values of the gating ratio can be expected. Though the graded film provides a better field-effect than the non-graded film, the asymmetrical $V_{PZT}$ requires higher switching field and special attention should be paid to the strain conservation for a thicker film where a low Ti-ratio PZT film has large lattice mismatching with the LAO-STO structure.

Incorporation of ferroelectric polarization gradients in a non-volatile gate insulator enables significantly enhanced gate-channel coupling, manifested as a 1-2 orders of magnitude increase in the on/off ratio. While this effect was demonstrated for PZT/LAO/STO, ferroelectric polarization gradient-enhanced gate insulators can be introduced and coupled to any of the aforementioned and other low-dimensional channels to produce similarly large enhancements.

In some aspects, the polarization gradient of the compositionally graded ferroelectric film of this disclosure can be mapped out by Transmission Electron Microscopy (TEM). FIGS. 5A-5B and 6A-6B show TEM images of $PbZr_{0.2}Ti_{0.8}O_3$ films and their lattice constants in-plane and out-of-plane, and the polarization magnitude and direction (Jia et al., *Nature Materials*, 6, 64-69, 2007). FIGS. 7A-7E show another TEM image of a graded PZT film whose composition variation is opposite to the film in FIGS. 5A-5B and 6A-6B. The lattice strains in-plane and out-of-plane are mapped, and the lattice constants and the polarizations are shown in FIGS. 7A-7E (Agar et al., *Nature Materials*, 15, 549-557, 2016).

Unless otherwise indicated, all numbers expressing quantities of ingredients, properties such as molecular weight, percent, ratio, reaction conditions, and so forth used in the specification and claims are to be understood as being modified in all instances by the term "about," whether or not the term "about" is present. Accordingly, unless indicated to the contrary, the numerical parameters set forth in the specification and claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements.

It is to be understood that each component, compound, substituent or parameter disclosed herein is to be interpreted as being disclosed for use alone or in combination with one or more of each and every other component, compound, substituent or parameter disclosed herein.

It is also to be understood that each amount/value or range of amounts/values for each component, compound, substituent or parameter disclosed herein is to be interpreted as also being disclosed in combination with each amount/value or range of amounts/values disclosed for any other component(s), compounds(s), substituent(s) or parameter(s) disclosed herein and that any combination of amounts/values or ranges of amounts/values for two or more component(s), compounds(s), substituent(s) or parameters disclosed herein are thus also disclosed in combination with each other for the purposes of this description.

It is further understood that each range disclosed herein is to be interpreted as a disclosure of each specific value within the disclosed range that has the same number of significant digits. Thus, a range of from 1-4 is to be interpreted as an express disclosure of the values 1, 2, 3 and 4. It is further understood that each lower limit of each range disclosed herein is to be interpreted as disclosed in combination with each upper limit of each range and each specific value within each range disclosed herein for the same component, compounds, substituent or parameter. Thus, this disclosure to be interpreted as a disclosure of all ranges derived by combining each lower limit of each range with each upper limit of each range or with each specific value within each range, or by combining each upper limit of each range with each specific value within each range.

Furthermore, specific amounts/values of a component, compound, substituent or parameter disclosed in the description or an example is to be interpreted as a disclosure of either a lower or an upper limit of a range and thus can be combined with any other lower or upper limit of a range or specific amount/value for the same component, compound, substituent or parameter disclosed elsewhere in the application to form a range for that component, compound, substituent or parameter.

All documents mentioned herein are hereby incorporated by reference in their entirety or alternatively to provide the disclosure for which they were specifically relied upon. The applicant(s) do not intend to dedicate any disclosed embodiments to the public, and to the extent any disclosed modifications or alterations may not literally fall within the scope of the claims, they are considered to be part hereof under the doctrine of equivalents.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meanings of the terms in which the appended claims are expressed.

What is claimed is:

1. A ferroelectric gate device for a field effect transistor comprising a compositionally graded ferroelectric film including a ferroelectric material having a formula of:

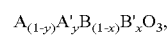

$$A_{(1-y)}A'_yB_{(1-x)}B'_xO_3,$$

wherein A and A' each represent an element independently selected from lanthanides, alkaline earth metals, and alkali metals, B and B' each represent an independently selected transition metal, x is in the range of from 0 to 1, and y is in the range of from 0 to 1, and the ferroelectric material has a composition gradient along a thickness of the ferroelectric film with x decreasing from one side to another side of the ferroelectric film.

2. The ferroelectric gate device of claim 1, wherein the composition gradient is along the entire thickness of the ferroelectric film.

3. The ferroelectric gate device of claim 1, wherein the field effect transistor has a channel and the gradient of the ferroelectric material has x decreasing from a side distal to the channel to a side proximal to the channel.

4. The ferroelectric gate device of claim 1, wherein x is in a range of from about 0.1 to about 0.9.

5. The ferroelectric gate device of claim 1, wherein x is in a range of from about 0.2 to about 0.8.

6. The ferroelectric gate device of claim 1, wherein x is in a range of from about 0.3 to about 0.7.

7. The ferroelectric gate device of claim 1, wherein y is about 0.

8. The ferroelectric gate device of claim 1, wherein the ferroelectric material is selected from $PbZr_{1-x}Ti_xO_3$ and $Ba_xSr_{(1-x)}TiO_3$.

9. The ferroelectric gate device of claim 1, wherein the transistor includes a channel that comprises a material selected from C, Si, Ge, SiC, SiGe, AlSb, AlAs, MN, AlP, BN, BP, BaS, GaSb, GaAs, GaN, GaP, InSb, InAs, InN, InP, AlGaAs, $Al_xGa_{1-x}As$ or $In_xGa_{1-x}As$ where x is in the range of from 0 to 1, InGaAs, InGaP, AlInAs, AlInSb, GaAsN, GaAsP, AlGaN, AlGaP, InGaN, InAsSb, InGaSb, AlGaInP, InAlGaP, InGaAlP, AlInGaP, AlGaAsP, InGaAsP, AlInAsP, AlGaAsN, InGaAsN, InAlAsN, GaAsSbN, GaInNAsSb, GaInAsSbP, CdSe, CdS, CdTe, ZnO, ZnSe, ZnS, ZnTe, CdZnTe, CZT, HgCdTe, HgZnTe, HgZnSe, CuCl, PbSe, PbS, PbTe, SnS, SnTe, PbSnTe, $Tl_2SnTe_5$, $Tl_2GeTe_5$, $Bi_2Te_3$, $Cd_3P_2$, $Cd_3As_2$, $Cd_3Sb_2$, $Zn_3P_2$, $Zn_3As_2$, $Zn_3Sb_2$, $PbT_2$, $MoS_2$, GaSe, SnS, $Bi_2S_3$, CIGS, PtSi, $BiI_3$, $HgI_2$, TlBr, $TiO_2$, $Cu_2O$, CuO, $UO_2$, $UO_3$, graphene, carbon nanotube, semiconductor nanowire.

10. The ferroelectric gate device of claim 9, wherein the channel comprises a material selected from Si, SiGe, GaAs, GaN, graphene, carbon nanotube, semiconductor nanowire, ZnO, and $MoS_2$.

11. The ferroelectric gate device of claim 1, wherein the transistor includes a channel that comprises an $LaAlO_3$—$SrTiO_3$ interface.

12. The ferroelectric gate device of claim 1, wherein the ferroelectric film enables at least about a 5-fold increase in a channel conductance on/off ratio of the transistor in comparison with a ferroelectric film of the same thickness but without a composition gradient.

13. The ferroelectric gate device of claim 1, wherein the ferroelectric film enables at least about a 10-fold increase in channel conductance on/off ratio of the transistor in comparison with a ferroelectric film of the same thickness but without a composition gradient.

14. The ferroelectric gate device of claim 1, wherein the ferroelectric film enables at least about a 15-fold increase in channel conductance on/off ratio of the transistor in comparison with a ferroelectric film of the same thickness but without a composition gradient.

15. The ferroelectric gate device of claim 1, wherein the ferroelectric film enables at least about a 25-fold increase in channel conductance on/off ratio of the transistor in comparison with a ferroelectric film of the same thickness but without a composition gradient.

16. The ferroelectric gate device of claim 1, wherein the ferroelectric film has a thickness of from about 30 nm to about 150 nm.

17. The ferroelectric gate device of claim 1, wherein the ferroelectric film has a thickness of from about 50 nm to about 150 nm.

18. The ferroelectric gate device of claim 1, wherein the ferroelectric film has a thickness of from about 50 nm to about 100 nm.

19. The ferroelectric gate device of claim 1, wherein the ferroelectric film has a thickness of from about 80 nm to about 100 nm.

20. The ferroelectric gate device of claim 3, wherein the channel is selected from two-dimensional, one-dimensional and one-dimensional like channels.

* * * * *